United States Patent
Tsuchiya et al.

(10) Patent No.: US 7,209,584 B2
(45) Date of Patent: Apr. 24, 2007

(54) PATTERN INSPECTION APPARATUS

(75) Inventors: Hideo Tsuchiya, Kawasaki (JP); Shinji Sugihara, Tokyo (JP); Kyoji Yamashita, Yokohama (JP); Toshiyuki Watanabe, Yokohama (JP); Kazuhiro Nakashima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 11/079,338

(22) Filed: Mar. 15, 2005

(65) Prior Publication Data

US 2005/0172255 A1    Aug. 4, 2005

Related U.S. Application Data

(62) Division of application No. 10/252,718, filed on Sep. 24, 2002, now Pat. No. 6,883,160.

(30) Foreign Application Priority Data

Sep. 26, 2001    (JP)    ............................ 2001-294854

(51) Int. Cl.
*G06F 17/50*    (2006.01)
*G06F 9/00*    (2006.01)

(52) U.S. Cl. .................... 382/145; 382/144; 716/21
(58) Field of Classification Search ............... 716/19, 716/21; 702/82; 430/5; 382/144–145, 149, 382/151

See application file for complete search history.

(56) References Cited

U.S. PATENT DOCUMENTS

| 4,996,434 | A  | 2/1991  | Tanaka         |
|-----------|----|---------|----------------|
| 5,379,348 | A  | 1/1995  | Watanabe et al.|
| 5,404,410 | A  | 4/1995  | Tojo et al.    |
| 5,475,766 | A  | 12/1995 | Tsuchiya et al.|
| 5,602,645 | A  | 2/1997  | Tabata et al.  |
| 5,844,809 | A  | 12/1998 | Yamashita      |
| 6,285,783 | B1 | 9/2001  | Isomura et al. |

FOREIGN PATENT DOCUMENTS

JP    3154802    2/2001

*Primary Examiner*—Stacy A Whitmore
(74) *Attorney, Agent, or Firm*—Oblon, Spivak, McClelland, Maier & Neustadt, P.C.

(57) ABSTRACT

A pattern inspection apparatus determines a difference of the measured dislocation of respective alignment marks of an opaque pattern and a phase shifting pattern (measurement difference), in addition to a difference between the both alignment mark positions in design (design difference). A difference between the measurement difference and the design difference is set as a difference in alignment mark position between the opaque pattern and the phase shifting pattern in a reference pattern which is later used in inspection. In this manner, by correcting one pattern data with respect to the other pattern data in the reference pattern, the displacement generated in the both patterns can be reflected, and the reference pattern data regarding an image of a sample which is actually observed can be created.

5 Claims, 20 Drawing Sheets

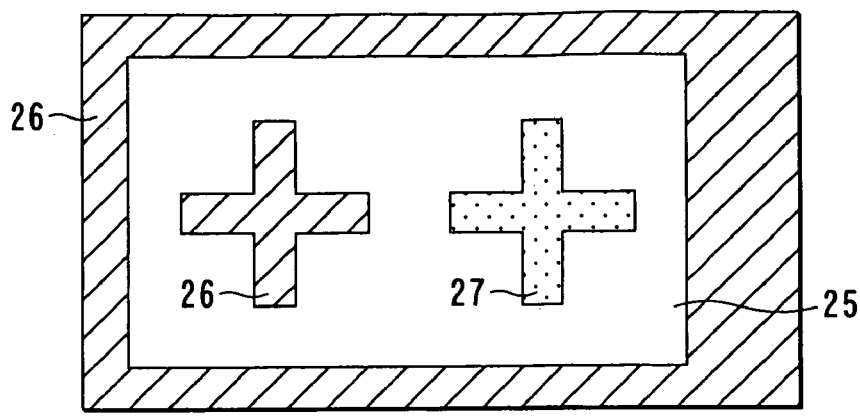
FIG. 14C
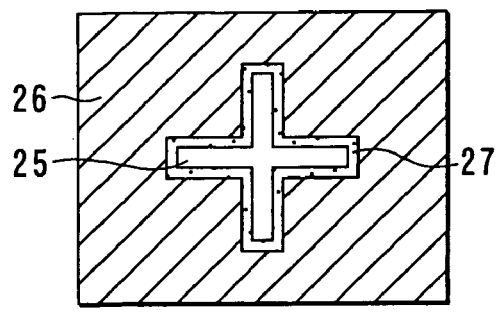 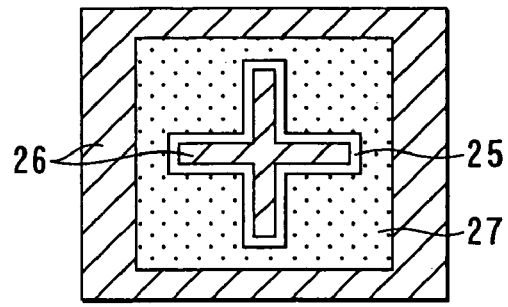
FIG. 14D  FIG. 14E
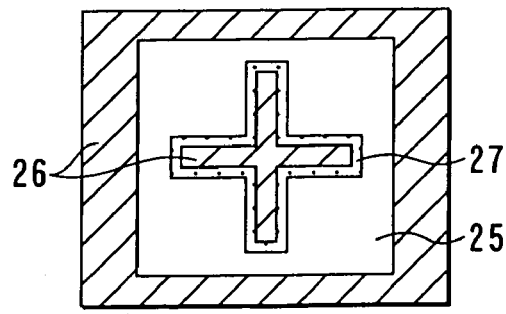
FIG. 14F

PATTERN INSPECTION APPARATUS

CROSS-REFERENCE TO RELATED APPLICATIONS

The present divisional application claims the benefit under 35 U.S.C. § 120 of utility application Ser. No. 10/252,718, filed Sep. 24, 2002, now U.S. Pat. No. 6,883,160, and also claims the benefit under 35 U.S.C § 119 of Japanese application no. 2001-294854, filed Sep. 26, 2001, the entire contents of which are incorporated herein by reference.

BACKGROUND OF THE INVENTION

1. Field of the Invention

The present invention relates to a pattern inspection apparatus for a sample to which a pattern is formed, for example, a photomask for a semiconductor integrated circuit.

2. Description of the Related Art

In a manufacturing process of a large-scale integration (LSI), a reduction exposure apparatus for circuit pattern transferring (stepper) uses a photomask obtained by enlarging a circuit pattern fourfold- or fivefold-wide as an original plate. The demand for the integrity to the photomask (pattern accuracy or zero defects) is increasing year by year. In recent years, pattern transferring is performed in the vicinity of the limit resolution of the stepper by hyperfine/high integration, and the highly accurate photomask is essential for the device manufacturing.

Above all, improvement in performance of the mask inspection apparatus which detects defects in the hyperfine pattern is a must in improvement of short-term development/manufacturing yield of the advanced semiconductor device. FIG. 1 shows an example of such a pattern inspection apparatus.

This apparatus enlarges the pattern formed on the photomask 1 by using a microscope or the like, this enlarged pattern is divided into thin stripes having a width (W) of approximately 200 μm as shown in FIG. 2, and this stripe is continuously (actually, a table continuously moves) scanned, thereby inspecting defects.

Again referring to FIG. 1, the photomask 1 is mounted on an XYθ table 2, and a pattern formed on the photomask 1 is illuminated by an appropriate light source 3. The light transmitted through the photomask 1 enters a photodiode array 5 through magnification optics 4, and an optical image of the pattern is formed on the photodiode array 5.

The optical image of the pattern formed on the photodiode array 5 is photo-electrically converted by the photodiode array 5, and subjected to A/D conversion by a measured pattern data acquisition circuit ("measured data acquisition" in FIG. 1) 6. Measurement pattern data outputted from this measured pattern data acquisition circuit 6 is supplied to a reference data generation circuit ("reference data generator" in FIG. 1) 8 together with data indicative of a position of the photomask 1 on the XYθ table 2 outputted from a positional data acquisition circuit 7.

On the other hand, pattern design data used in pattern formation to the photomask 1 is read to a bit pattern generation circuit ("bit pattern generator" in FIG. 1) 11 from a magnetic disc 9 through a control computer 10. The bit pattern generation circuit 11 converts the pattern design data into bit pattern data in units of, e.g., pixels, and supplies this bit pattern data to the reference data generation circuit 8.

The reference data generation circuit 8 generates multiple-valued reference data by applying appropriate filtering processing to the supplied bit pattern data of the figure. Since the measured pattern data obtained from the measured pattern data acquisition circuit 6 is blurred due to the resolving characteristic of the magnification optics 4, the aperture effect of the photo diode array 5 or coherence between adjacent pixels, the multiple-valued data is obtained by applying the filtering processing to the data on the design side so that it can be readily compared with the measured pattern data.

A comparison circuit 12 compares the measured pattern data with the multiple-valued reference data in accordance with an appropriate algorithm, and determines existence of a defect when the data does not match.

Meanwhile, emergence of an LSI with a higher integration is demanded in recent years. Based on this, further improvement in the resolution of an optical aligner is demanded. As means for realizing these demands, there is proposed provision of a phase shifting pattern which utilizes coherence of the light in the photomask.

That is, as shown in FIG. 3, the pattern formed on the photomask 1 is divided into a peripheral pattern 21 and a circuit pattern 22. The circuit pattern 22 is divided into a logic controller part 23 and a memory part 24. The phase shifting pattern must be formed on a part of the circuit pattern 22 at which a fine pattern is required in particular.

In a usual photomask, a chrome layer having a light shielding function on a surface of a glass substrate is provided with a predetermined shape (which will be referred to as a chrome pattern hereinafter). The phase shifting pattern is usually formed of a translucent material such as $SiO_2$.

Various types are considered for the structure of the phase shifting; an alternating phase shifting type shown in FIG. 4A, assist pattern type shown in FIG. 4B, edge enhanced type shown in FIG. 4C, chrome-less type shown in FIG. 4D, attenuated phase shifting type shown in FIG. 4E or the like. Incidentally, in FIGS. 4A to 4E, reference numeral 25 denotes a glass substrate; 26, a chrome pattern; and 27, a phase shifting pattern.

Based on these circumstances, a function capable of accurately detecting a pattern defect including a defect of the phase shift pattern is required for the pattern inspection apparatus. In the conventional inspection apparatus shown in FIG. 1, however, if both the chrome pattern and the phase shift pattern exist in the photomask, there is a problem that defects of both the patterns cannot be simultaneously detected.

As described above, in the conventional pattern inspection apparatus which detects a pattern defect by comparing the pattern design data used for forming a pattern and the measured data actually measured, the light intensity profile observed in the photo diode array 5 is as shown in FIGS. 5A to 5E if both the chrome pattern 26 such as shown in FIGS. 4A to 4E and the phase shifting pattern 27 exist in the photomask.

Incidentally, FIGS. 4A to 4E and FIGS. 5A to 5E correspond to each other. Further, the light intensity profile when the pattern shown in FIGS. 4A to 4E is formed by only the chrome pattern 26 is as shown in FIGS. 6A to 6E.

When both the chrome pattern 26 and the phase shifting pattern 27 exist, the light intensities corresponding to the respective patterns are apparently different. That is, as shown in FIGS. 6C and 6D, there is a characteristic of a so-called tri-tone state that the light intensity greatly varies at the contour part of the phase shifting pattern 27 or the light intensity of the phase shifting pattern 27 becomes an intermediate value of the glass portion 25 and the chrome pattern 26.

For inspecting such a chrome/phase shifting pattern mixed mask, the light intensity of the pattern shown in, e.g., FIG. 7A along the line A—A becomes as shown in FIG. 7B in particular. In this case, the actual inspected pattern is within an allowance but the chrome pattern and the phase shifting pattern do not overlap in accordance with the design data due to the pattern displacement when forming the chrome pattern 26 and when forming the phase shifting pattern 27 or irregularities in the manufacturing process.

If an allowable defect is rigorously detected as a defect, an operator must later make judgment upon whether repair is necessary, which deteriorates the overall efficiency. Therefore, preventing an allowable defect from being pointed out greatly contributes to improvement in performance of the inspection apparatus.

For example, part B in FIG. 7A may generate the displacement or have the line width which is not finished according to the design data as with part B' in FIG. 7C. In such a case, if the defect detection sensitivity is increased, that part is erroneously detected as a false defect. Therefore, there is a problem that the defect detection sensitivity cannot be satisfactorily obtained.

Further, if a corner portion of design data such as shown in FIG. 8A is rounded as with an observed pattern in FIG. 8B, there is generated a difference between these patterns as shown in FIG. 8C, and this is detected as a defect. Therefore, there is also a problem that the detection sensitivity cannot be satisfactorily obtained.

Therefore, there is demanded emergence of a pattern inspection apparatus which does not determine an allowable displacement between the both patterns as a false defect and can efficiently simultaneously inspect the both patterns even in a photomask having both the chrome pattern and the phase shifting pattern.

BRIEF SUMMARY OF THE INVENTION

According to a first aspect of the present invention, there is provided a pattern inspection apparatus which inspects a pattern formed on a plate, comprising:

a pattern data generator configured to generate measured pattern data regarding the pattern on the plate;

a memory which stores first designed data and second designed data, the first designed data representing an opaque pattern including a first alignment mark and the second designed data representing a phase shifting pattern including a second alignment mark;

a bit pattern data generator configured to provide first bit pattern data obtained by converting the first designed data to a two-dimensional image pattern data configured of squares in units of bit, and second bit pattern data obtained by converting the second designed data to another two-dimensional image pattern data configured of squares in units of bit;

a positional corrector configured to correct a relative position between the phase shifting pattern and the opaque pattern by correcting data of the phase shifting pattern with respect to data of the opaque pattern by a difference between a measured data difference and a designed data difference to obtain first corrected bit pattern data and second corrected bit pattern data, the measured data difference concerning a difference of respective measured data of the first alignment mark and the second alignment mark which are obtained based on the measured pattern data, and the designed data difference concerning a difference of respective designed data of the first alignment mark and the second alignment mark;

a reference pattern data generator configured to generate reference pattern data by combining the first corrected bit pattern data and the second corrected bit pattern data; and a comparator configured to compare the reference pattern data with the measured pattern data to inspect a defect of the pattern on the plate.

According to a second aspect of the present invention, there is provided a pattern inspection apparatus which inspects a pattern formed on a plate, comprising:

a pattern data generator configured to generate measured pattern data regarding the pattern on the plate;

a memory which stores first design data and second design data, the first designed data representing an opaque pattern including a first alignment mark and the second designed data representing a phase shifting pattern including a second alignment mark;

a bit pattern data generator configured to provide first bit pattern data obtained by converting the first designed data to a two-dimensional image data configured of squares in units of bit, and second bit pattern data obtained by converting the second designed data to another two-dimensional image data configured of squares in units of bit, the bit pattern data generator including:

a figure data interpretation part configured to sequentially interpret figure data of the first designed data and the second designed data from the memory;

a bit pattern data generation part configured to sequentially generate bit pattern data of the first designed data and the second designed data; and a stripe pattern memory which stores a precedently generated one of the bit pattern data of either the first design data or the second design data, and outputs the precedently generated bit pattern data in synchronization with a subsequently generated one of the bit pattern data, a reference pattern data generator generating reference pattern data for comparison with the measured pattern data, by having a first two-dimensional filter which applies first filtering processing while performing positional correction to the first bit pattern data based on measured data of the first alignment mark and a second two-dimensional filter which applies second filtering processing while performing positional correction to the second bit pattern data based on measured data of the second alignment mark, and combining results of the first filtering processing and the second filtering processing; and a comparator configured to compare the reference pattern data with the measured pattern data to inspect a defect of the pattern on the plate.

According to a third aspect of the present invention, there is provided a pattern inspection apparatus which inspects a pattern formed on a plate, coprising:

a pattern data generator configured to generate measured pattern data regarding the pattern on the plate;

a memory which stores first design data and second design data, the first designed data representing an opaque pattern including a first alignment mark and the second designed data representing a phase shifting pattern including a second alignment mark;

a control computer configured to control extraction of a first inspection area and a second inspection area, the first inspection area having a predetermined width from one design data of the first design data and the second design data, the second inspection stripe area being obtained by correcting a designed position of one of the first alignment mark and the second alignment mark by a difference between a measured data difference and a designed data difference with respect to the other designed data of the first designed data and the second designed data, the measured data difference concerning a difference of respective measured data of the first alignment mark and the second alignment mark which are obtained based on the measured pattern data, and the designed data difference concerning a difference of respective designed data of the first alignment mark and the second alignment mark;

a bit pattern data generator configured to provide first bit pattern data obtained by converting the one designed data included in the first inspection stripe area to a two-dimensional image data configured of squares in units of bit, and second bit pattern data obtained by converting the other designed data included in the second inspection stripe area to another two-dimensional image data configured of squares in units of bit;

a reference pattern data generator configured to generate reference pattern data by performing combining and filtering the first bit pattern data and the second bit pattern data; and a comparator configured to compare the reference pattern data with the measured pattern data to inspect a defect of the pattern on the plate.

BRIEF DESCRIPTION OF THE SEVERAL VIEWS OF THE DRAWING

FIGS. 14A to 14F show shape examples of the alignment mark;

DETAILED DESCRIPTION OF THE INVENTION

In the present invention, when a chrome pattern and a phase shifting pattern do not overlap in accordance with design data and a displacement is generated or a line width is not based on the design data due to a pattern displacement when forming an opaque pattern, i.e., chrome pattern and when forming a phase shifting pattern or irregularities in the manufacturing process, a relative position of the design data between the chrome pattern and the phase shift pattern is corrected by using a difference of an amount of displacement from normal positions of the both actually measured patterns. Since pattern inspection is carried out by using the design pattern after correction, defects in the both patterns can be simultaneously detected without determining an allowable displacement as a false defect.

Further, since identification data, i.e., information indicative of presence/absence of the phase shifting pattern, a structure or a type of the phase shifting pattern is given to the design data stored in a memory unit, an inspection method or an inspection algorithm can be changed any time during execution of inspection based on this information.

Embodiments according to the present invention will now be described in detail hereinafter with reference to the accompanying drawings.

(First Embodiment)

Figure 1:
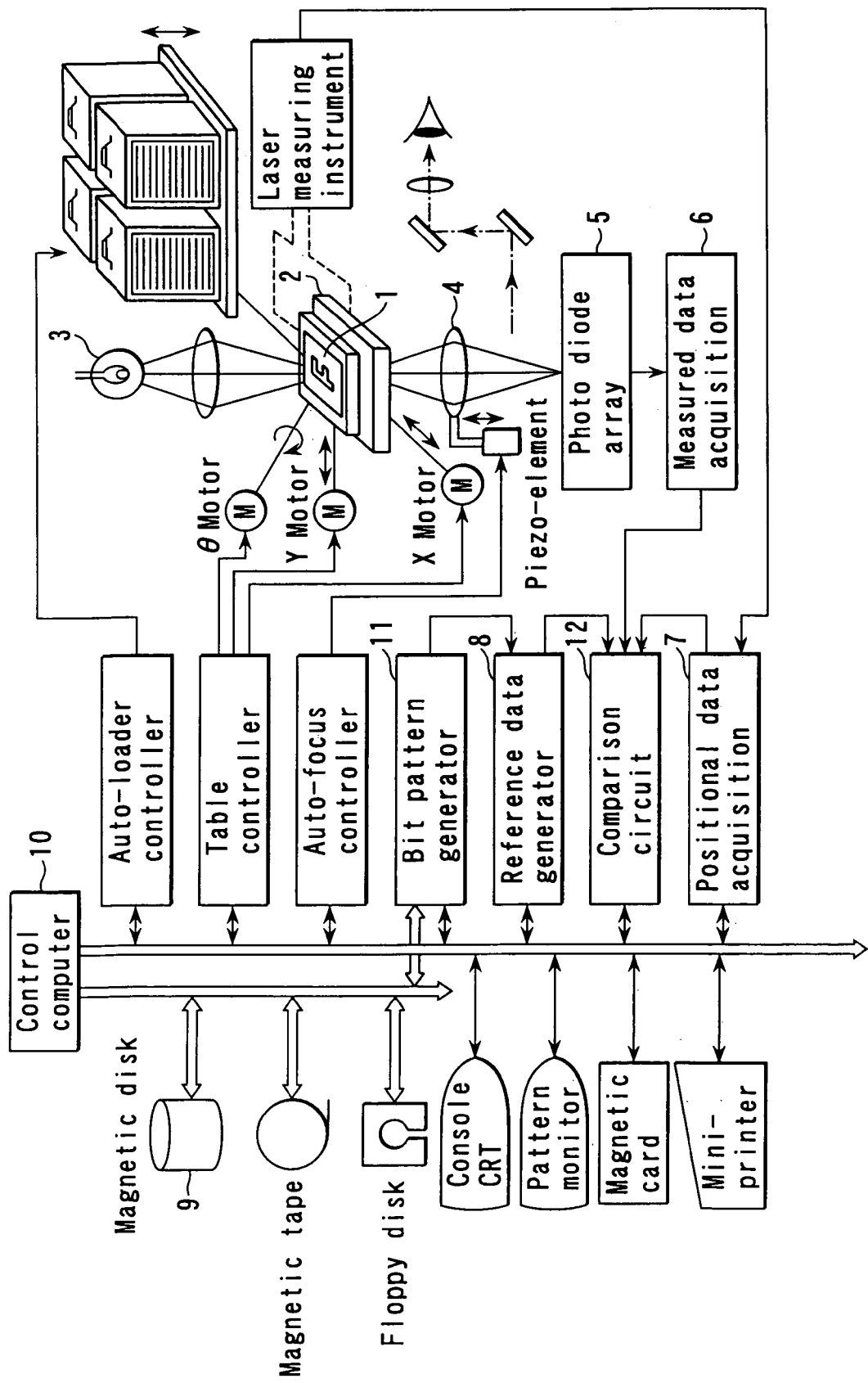
FIG. 1 is a block diagram showing a structure of a conventional pattern inspection apparatus.
Figure 9:
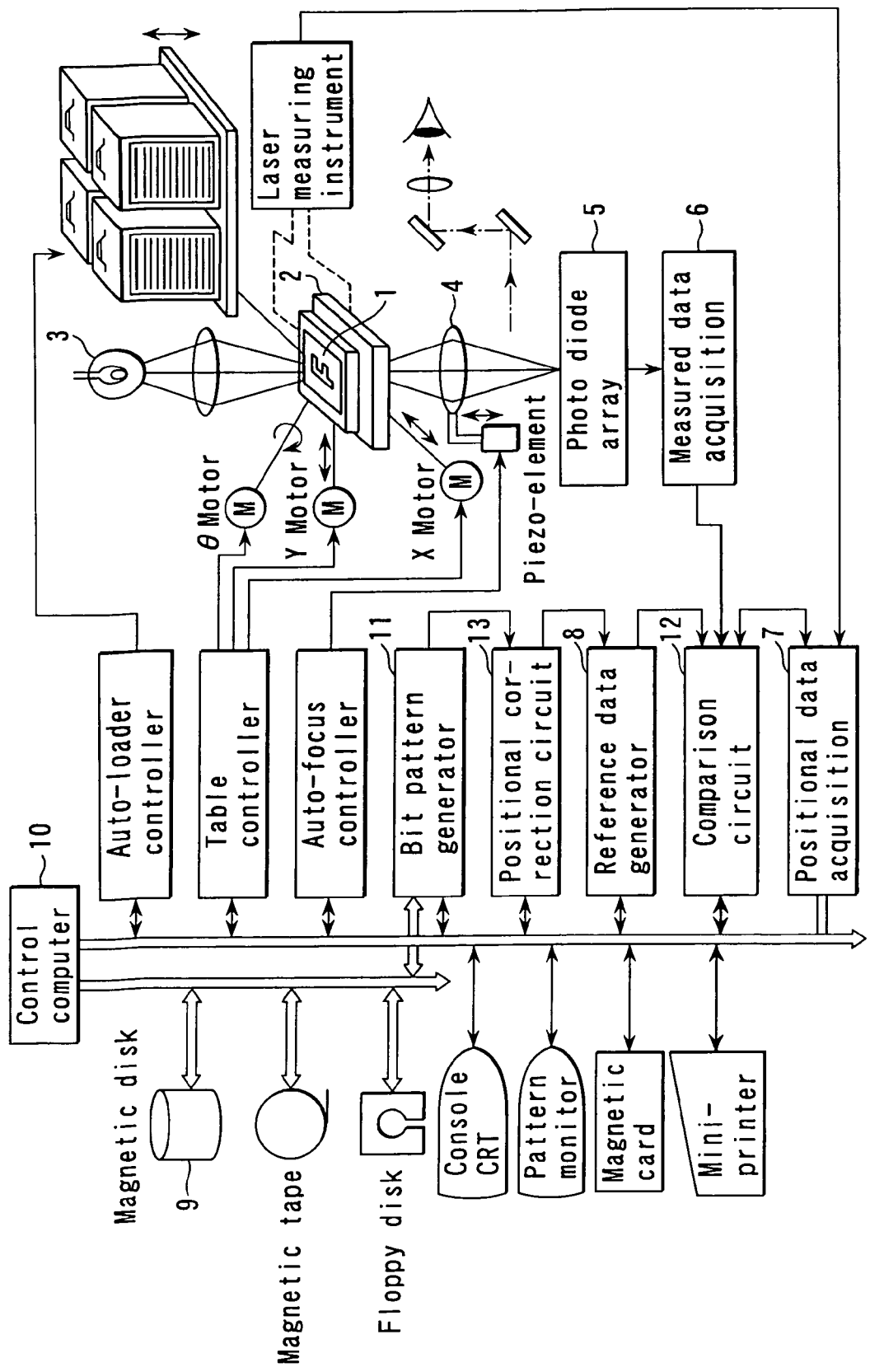
FIG. 9 is a block diagram showing a structure of a pattern inspection apparatus according to the first embodiment.

FIG. 9 is a block diagram showing a structure of a pattern inspection apparatus according to a first embodiment. Since this structure is basically the same as that of the prior art apparatus shown in FIG. 1, like reference numerals denote like or corresponding part. Further, detailed explanation of like parts will be omitted.

The apparatus of FIG. 9 is different from the prior art apparatus in that a magnetic disk unit 9 stores therein opaque pattern design data (data A) having alignment mark information used for forming an opaque pattern to the sample and phase shifting pattern design data (data B) having alignment mark information used for forming a phase shift pattern and they are used for inspection. Further, a positional correction circuit 13 is newly provided.

Figure 10A:
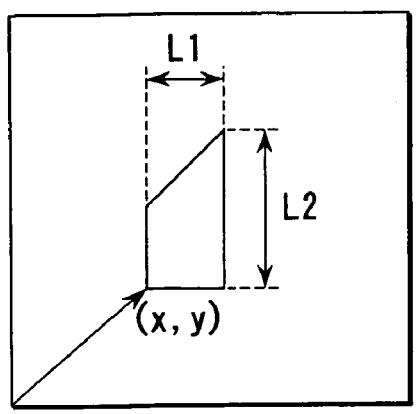
FIGS. 10A and 10B respectively show an example of a pattern and a format pattern of design data.
Figure 10B:
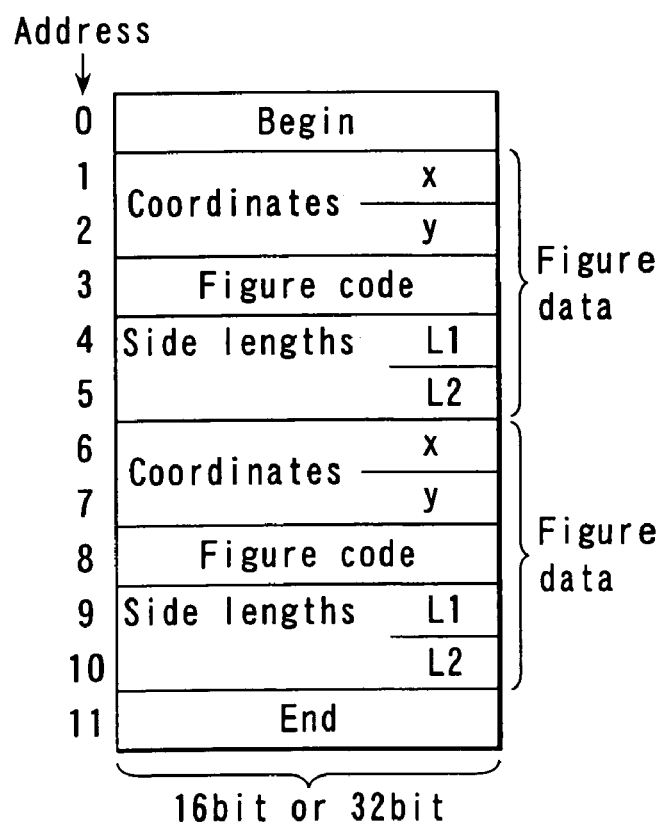

The pattern design data uses a rectangle or a triangle as a basic figure, and it is described by combining an X dimension $L_1$ and a Y height $L_2$ of a figure and an arrangement coordinate (x, y) of the figure as shown in FIG. 10A, for example. Further, the data includes an identifier which discriminates an opaque pattern and a phase shifting pattern from each other or setting conditions at the time of forming a pattern or inspection.

The inspection apparatus reads this data, and sets an operation mode of each circuit required for inspection in accordance with only the opaque pattern (chrome pattern) design data, only the phase shifting pattern design data, and both data.

Figure 2:
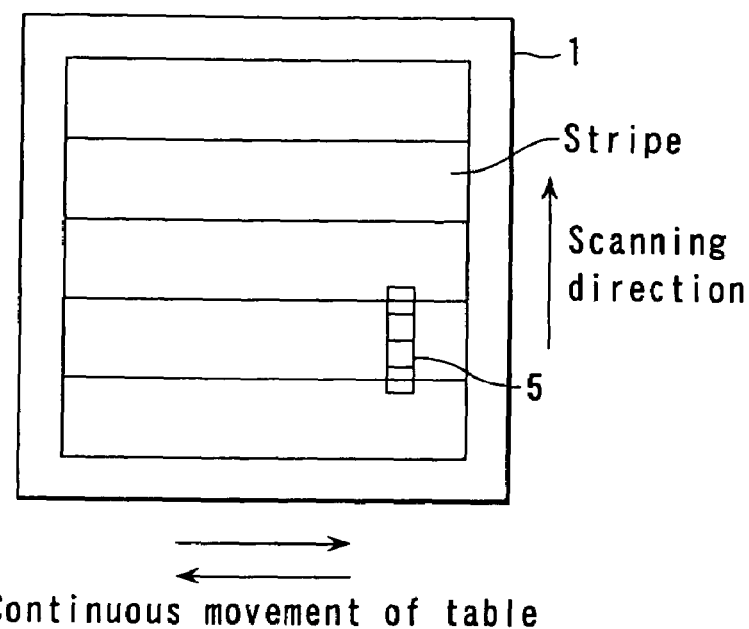
FIG. 2 is a conceptual view showing the relationship between a mask and an inspection stripe.
Figure 3:
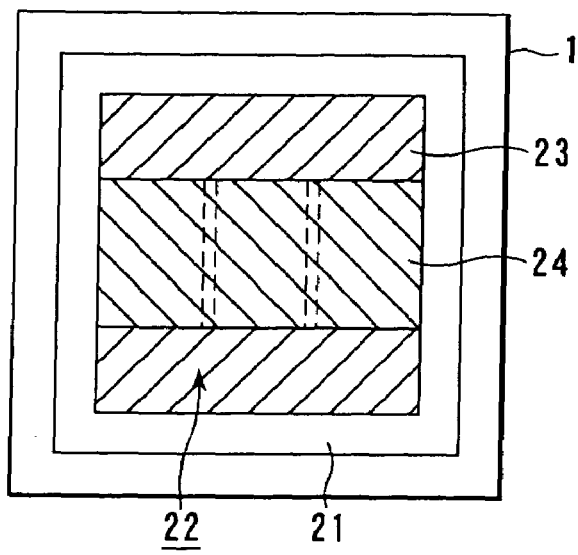
FIG. 3 is a pattern arrangement example of the mask.
Figure 4A:
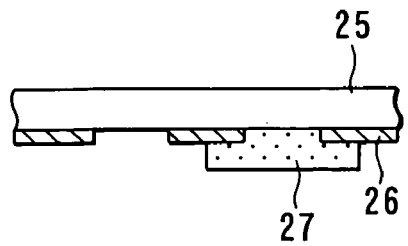
FIGS. 4A to 4E are views showing structural examples of the phase shifting mask.
Figure 4B:
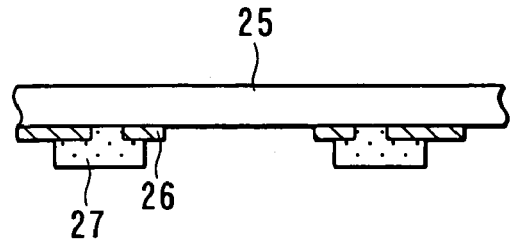
Figure 4C:
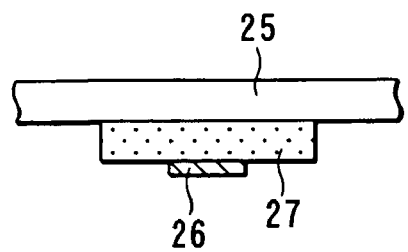
Figure 4D:
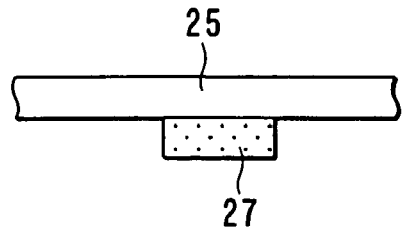
Figure 4E:
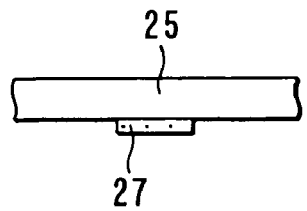
Figure 5A:
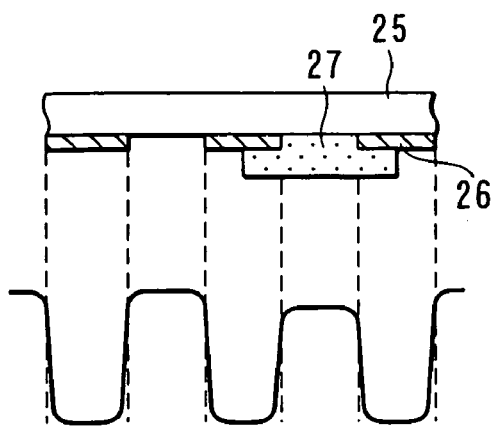
FIGS. 5A to 5E are views showing transmitted light intensity profiles at a part where both a chrome pattern and a phase shifting pattern exist and a part where only the phase shifting pattern exists in FIGS. 4A to 4E.
Figure 5B:
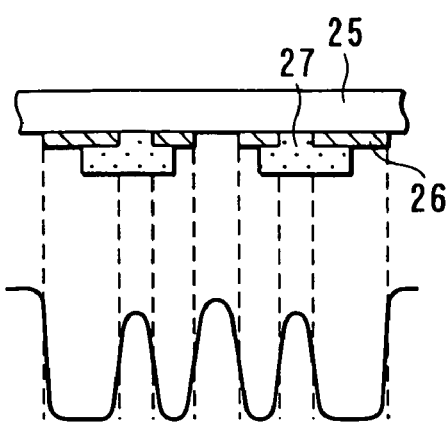
Figure 5C:
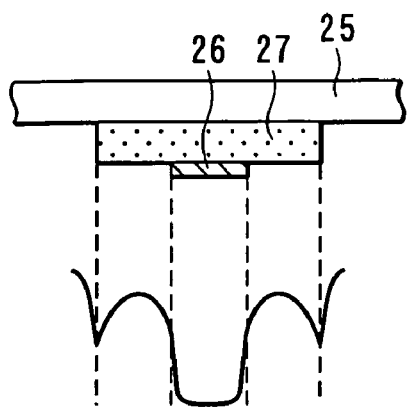
Figure 5D:
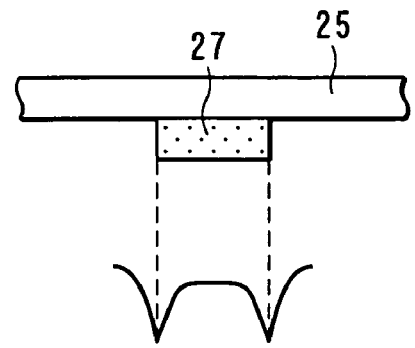
Figure 5E:
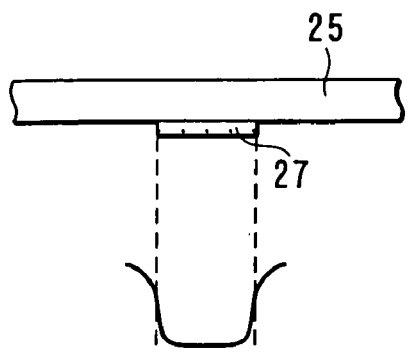
Figure 6A:
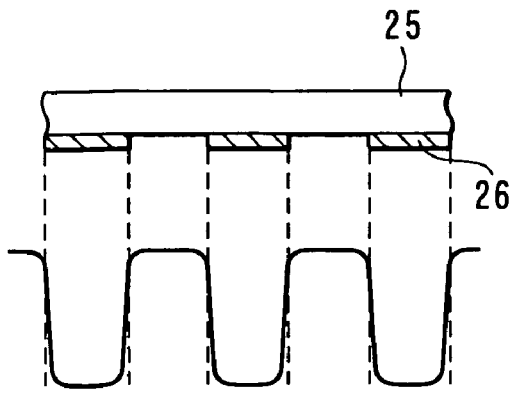
FIGS. 6A to 6E are views showing transmitted light intensity profiles when only the chrome pattern exists in the structures of FIGS. 4A to 4E.
Figure 6B:
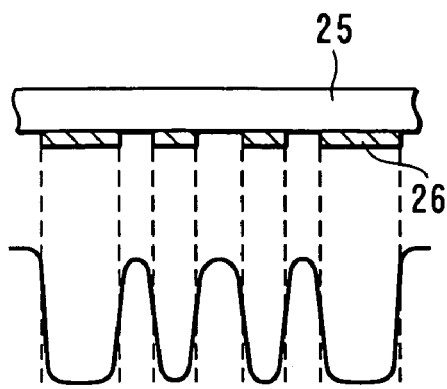
Figure 6C:
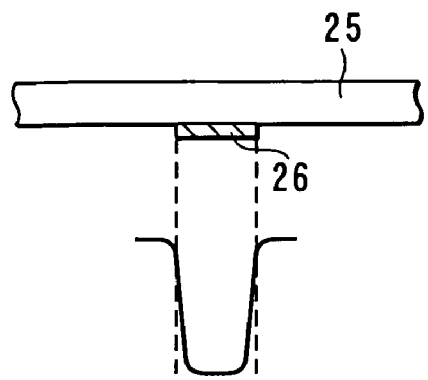
Figure 6D:
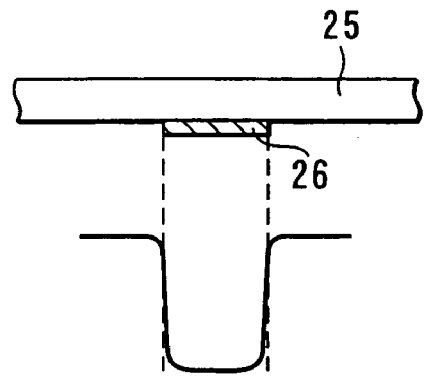
Figure 6E:
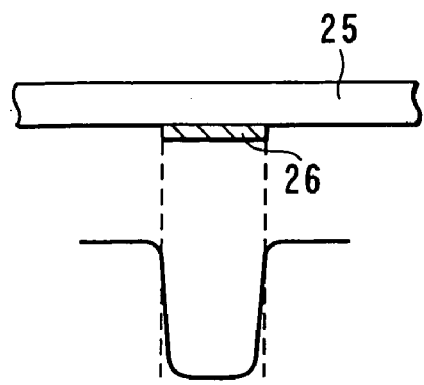
Figure 7A:
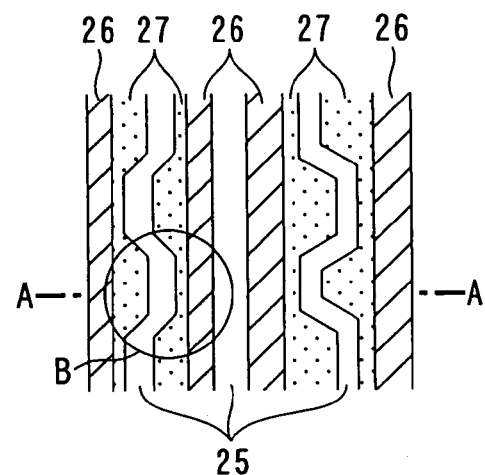
FIGS. 7A to 7D are views illustrating the relationship between displacement of an opaque pattern and the phase shifting pattern and the transmitted light intensity.
Figure 7B:
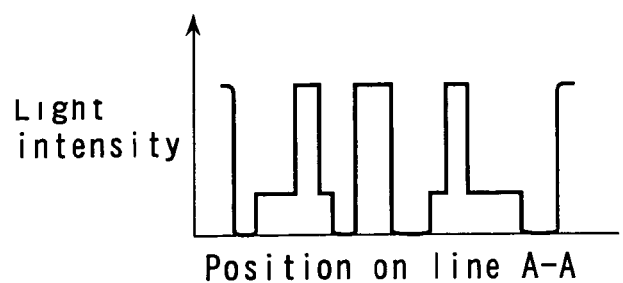
Figure 7C:
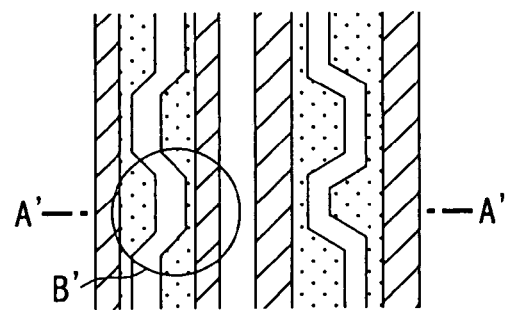
Figure 7D:
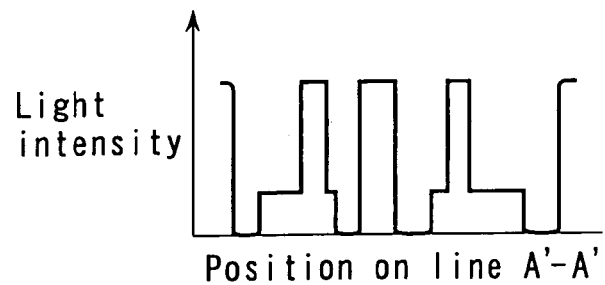
Figure 8A:
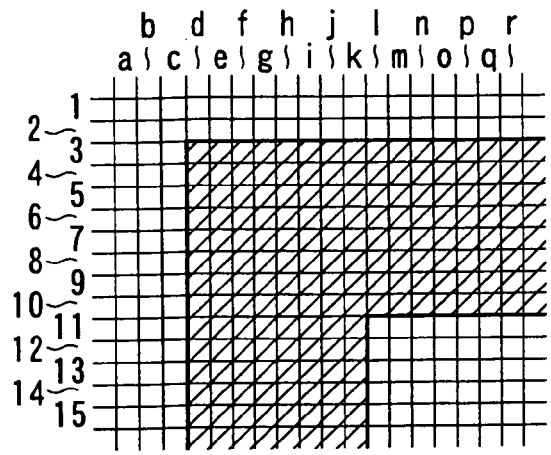
FIGS. 8A to 8C are views showing examples of a design pattern at a corner portion of the pattern, corner rounding in the actual pattern and a false defect which can be obtained in inspection, respectively.
Figure 8B:
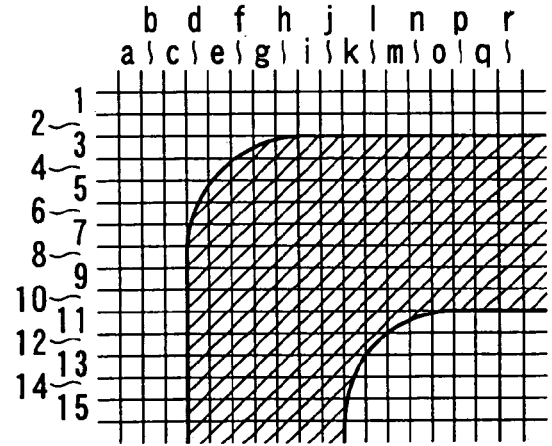
Figure 8C:
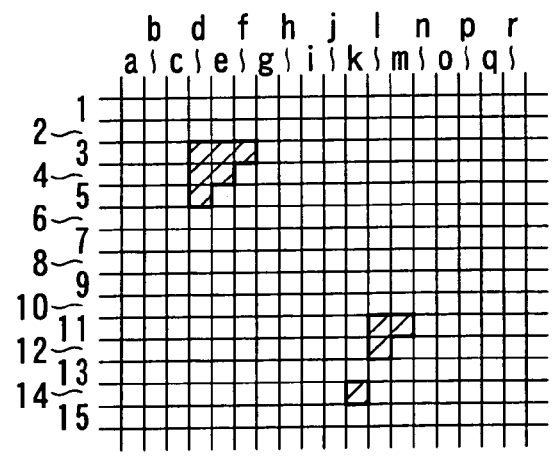
Figure 11:
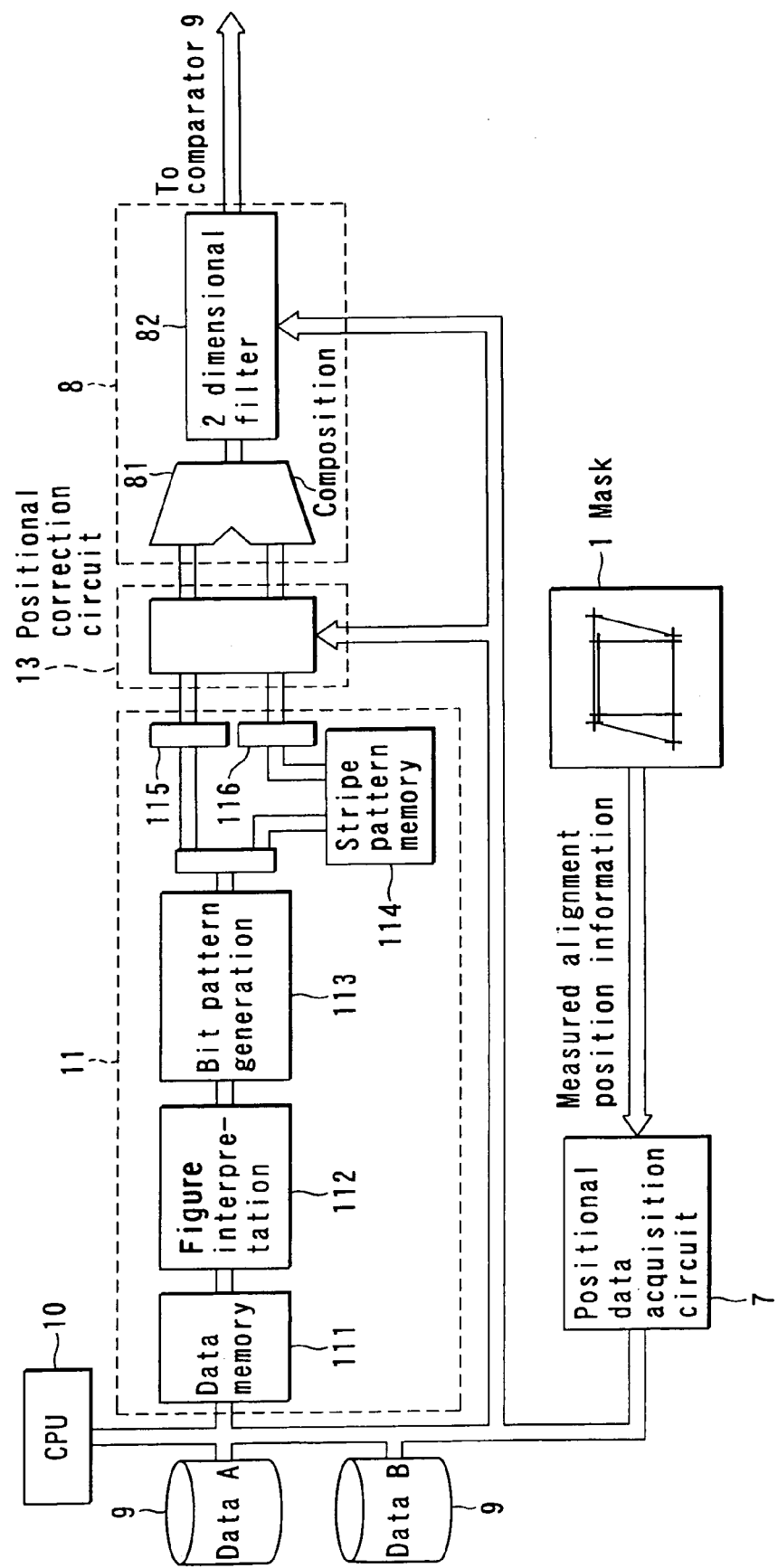
FIG. 11 is a block diagram of a primary portion of the pattern inspection apparatus according to the first embodiment.

A characteristic part of the first embodiment will now be described with reference to the block diagram of FIG. 11. A bit pattern generation circuit 11 receives data into a data memory portion 111 from the magnetic disk unit 9 through a control computer 10 with a rectangular area called an inspection stripe shown in FIG. 2 being determined as a unit.

The transmitted figure data is fed from the memory portion 111 to a figure interpretation part 112 where a figure code indicative of a figure shape or a figure dimension of the figure data is interpreted. The interpreted figure of the inspection stripe is further developed into bit pattern data in the bit pattern generation part 113.

The bit pattern data is obtained by converting the figure data to a two-dimensional image pattern data configured of squares in units of bit.

Although it can be considered that the dimension of one bit at this moment is based on a predetermined reference dimension called a design grid on the design data side, e.g., 100 nm or 10 nm, it is coordinated with one pixel dimension when obtaining a measured pattern by a sensor. Furthermore, one pixel is expressed by gray scale data on approximately 256 steps, thereby equivalently improving the resolution of the data.

The generated bit pattern data is temporarily stored in the stripe pattern memory 114 having a large capacity provided on an output stage of the bit pattern generation circuit 11. Its capacity is set to be large enough for storing bit pattern data for one inspection stripe.

In this embodiment, if both the opaque pattern (chrome pattern) design data and the phase shifting pattern design data exist, one of them is first processed in the bit pattern generation circuit 11 and the processed data is temporarily stored in a high-capacity pattern memory portion 114 provided on the output stage for one inspection stripe.

Then, the other one is processed in the bit pattern generation circuit 11. Note that such sequential processing is not required if only the opaque pattern (chrome pattern) design data or the phase shifting pattern design data exists.

When the above-described mixed data exists, the developed pattern data of the opaque pattern and the developed pattern data of the phase shifting pattern is inputted to a positional correction circuit 13 through synchronization buffers 115 and 116 provided on the output stage of the bit pattern development portion 11.

In detail, one of the bit pattern data of the opaque pattern and the phase shifting pattern is temporarily stored in the pattern memory portion 114. The other one is not temporarily stored in the pattern memory portion 114 but simultaneously outputted in synchronization with the former stored bit pattern data and inputted to the positional correction circuit 13.

On the other hand, the control computer (CPU) 10 obtains the measured alignment position information through the positional data acquisition circuit 7 and a displacement from a design position of each alignment mark of the opaque pattern and the phase shifting pattern acquired from the measured alignment position information, and obtains a difference between the displacements based on this.

The positional correction circuit 13 subtracts the difference (design difference) of the respective alignment marks of the opaque pattern and the phase shifting pattern obtained in the design data from the displacement difference (measurement difference) of the both alignment mark positions obtained through the positional data acquisition circuit 7, and determines it as a correction value a difference between the alignment mark position of the opaque pattern and that of the phase shifting pattern in a reference pattern which will be used in inspection later. As described above, by shifting one of the bit pattern data from the other one, the displacement generated between the patterns is reflected, and reference pattern data corresponding to an image of a sample which is actually observed is created.

The displacement from the design position of each alignment mark of the opaque pattern and the phase shifting pattern can be, as described above, obtained from the measured alignment position information of each of the opaque pattern and the phase shifting pattern. The measured alignment position information is generated by a laser measuring instrument 2 in synchronization with the alignment mark of the measured position acquisition circuit 6, and its positional coordinate information is inputted to the positional data acquisition circuit 7.

Then, the pattern data subjected to positional correction in the positional correction circuit 13 is inputted to the reference data generation circuit 8, wherein the pattern data is handled as vector data having a light intensity amplitude and phase with respect to each of the opaque pattern and the phase shifting pattern. These two data are composed in a composition part 81, including not only mere addition of the amplitude data but also complex number operation involving the positional information.

Further, a two-dimensional filter 82 applies filtering processing to the composed data in order to simulate the blur caused due to the resolution characteristic of the magnification optics 4, the aperture effect of the photodiode array 5, the coherence between adjacent pixels or the like.

The output from the reference data acquisition circuit 8 is inputted to comparison circuit 9 and compared with the measured pattern data fetched from the measured pattern data acquisition circuit 5 in accordance with an appropriate algorithm. If they do not match, it is determined that there is a defect.

Figure 12A:
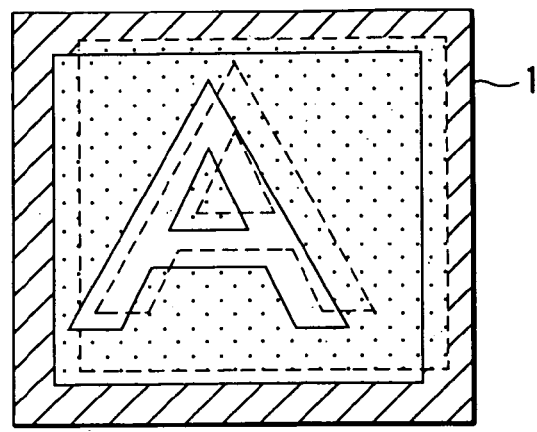
FIGS. 12A to 12C show examples of displacement of the pattern.
Figure 12B:
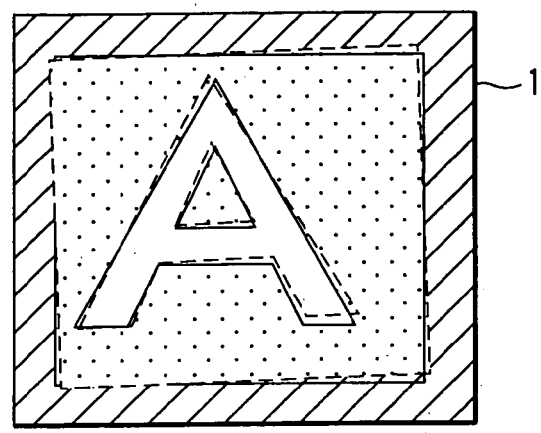
Figure 12C:
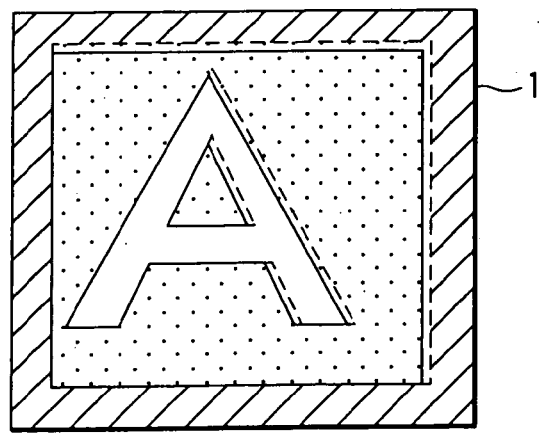

Here, description will be given as to the alignment by using FIGS. 12A to 12C. If both the opaque pattern (chrome pattern) and the phase shifting pattern exist, it can be assumed that the pattern displacement of the photomask is generated in such conformations as shown in FIGS. 12A to 12C. That is, for example, the entire character A is displaced in parallel as shown in FIG. 12A, it is rotated around a given point as shown in FIG. 12B, the both pattern positions are shifted due to a small error in the mask expanding direction as shown in FIG. 12C, or the like.

Figure 13:
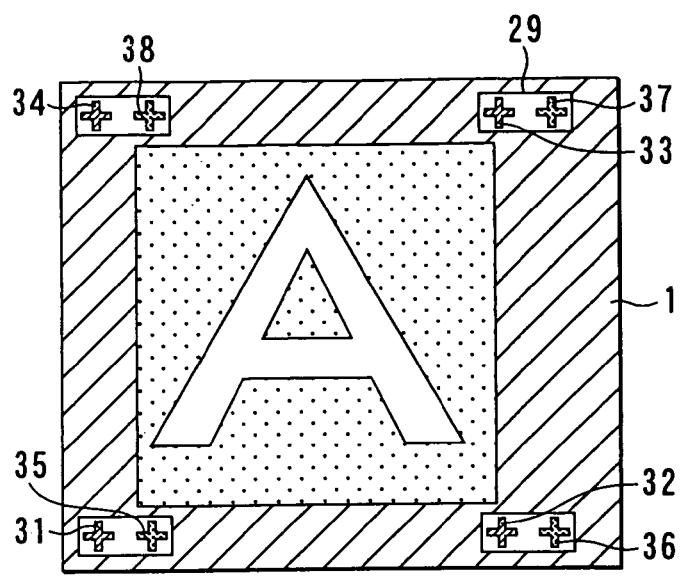
FIG. 13 shows an arrangement example of an alignment mark.

In order to measure this displacement, the coordinates of the alignment mark of each of the opaque pattern (chrome pattern) and the phase shifting pattern is measured as shown in FIG. 13. Since the alignment mark 29 is subjected to the formation/process treatment under the same conditions as that for the actual pattern, it is possible to assume the distortion or rotation of the mask at the time of forming a pattern to be inspected.

Marks 31 to 34 of the opaque pattern (chrome pattern) and marks 35 to 38 of the phase shifting pattern have the arrangement or mark shape which can be identified, and they are arranged to the outer peripheral portion of the inspected pattern (chip) in the design at apexes (four positions) of a rectangular where the X, Y coordinates can be easily grasped. An image of the actual mark is picked up from an area where each mark exists by the photodiode array 5, and the coordinate when the mark is captured is fetched as positional coordinate data to the positional data acquisition circuit 7 through the comparison circuit 12.

Figure 14A:
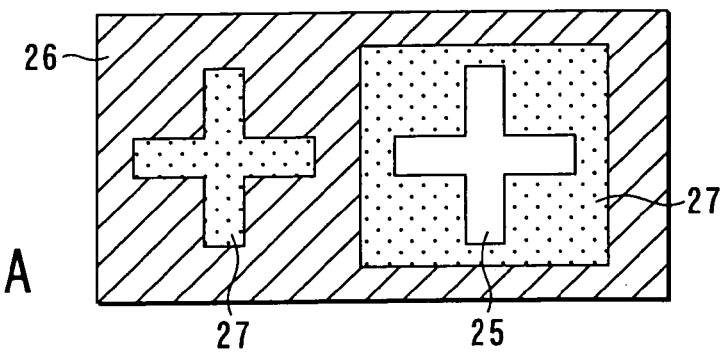

As to the shape of this alignment mark, various kinds of shapes can be considered. For example, an intersection of a cross mark such as shown in FIG. 14A is processed as the coordinate of the X, Y coordinate. In order to facilitate discrimination of the opaque pattern (chrome pattern) and the phase shifting pattern, the two cross marks are slightly shifted from each other so as not to overlap, and the cross mark of the phase shifting pattern 27 is arranged in the opaque pattern (chrome pattern) 26 while the cross mark of the glass 25 is arranged in the phase shifting pattern 27.

Figure 14B:
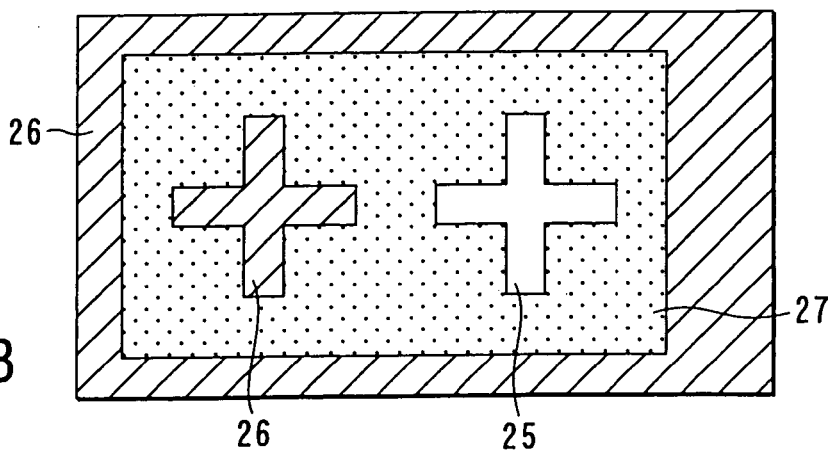

Modifications of the combination of the glass, the opaque pattern (chrome pattern) and the phase shifting pattern are shown in FIGS. 14B and 14C. Besides, even if the two cross marks are caused to overlap as shown in FIGS. 14D to 14F, identification is enabled by cogitating a judgment threshold value of the light intensity.

In the process of alignment, four coordinates of each of the opaque pattern (chrome pattern) and the phase shifting pattern are obtained by going around the four positions arranged to the outer peripheral portion of the inspected pattern (chip). The four points are determined as the first to fourth marks 31 to 34 of the opaque pattern and the first to fourth marks 35 to 38 of the phase shifting pattern in the counterclockwise direction from the lower left part.

Description will now be given as to the concept of correction in the pattern inspection apparatus according to the present invention. The alignment marks are arranged at positions at which the X, Y coordinate can be readily grasped such as the apexes (four positions) of the rectangular at the outer peripheral portion of the inspected pattern (chip) on the assumption that expansion and contraction, rotation and any other distortion similar to those when the alignment marks are actually formed are generated in the inspected pattern (chip) itself. Therefore, it is possible to assume what kinds of coordinate an arbitrary coordinate in the design data becomes on the actual mask by proportionally dividing the expansion and contraction or the rotational component by the proportional distribution of a distance based on the coordinates of the alignment marks at the four points.

As a general consideration on the alignment, if an error is only an error in parallel movement of the inspected pattern (chip) or an error in magnification, the error can be corrected by measuring arbitrary two points and obtaining a difference in dimension between the design data and the actual pattern without measuring four points.

Three points must be measured in order to take the mask rotation or an error in orthogonality into consideration. As to the three points, the structure in which two sides, i.e., the side of the first and second marks and the side of second and third marks form a right angle therebetween is desirable as with the first to third marks 31 to 33 shown in FIG. 13.

However, it is possible to comprehend that the inspected pattern (chip) is deformed into an arbitrary quadrangle by measuring the four point as shown in FIG. 13, and conversion including distortion correction from the design coordinate to the actual pattern coordinate can be performed at an arbitrary coordinate of the inspected pattern.

Although the above has described the alignment when only one of the opaque pattern (chrome pattern) or the phase shifting pattern exists, description will now be given as to the method of correcting the displacement by using both the first to fourth marks 31 to 34 of the opaque pattern and the first to fourth marks 35 to 38 of the phase shifting pattern as shown in FIG. 13.

With respect to the opaque pattern and the phase shifting pattern, a distortion/rotation error is first measured by using the alignment marks at the four points of each pattern, conversion including distortion correction into the actual pattern coordinate is performed relative to the design coordinate corresponding to an arbitrary coordinate of the inspected pattern.

When a given design coordinate value is converted into the actual pattern coordinate based on the alignment, the opaque pattern and the phase shift pattern respectively have slightly different coordinates. However, when generating the reference pattern data, a difference of the actual coordinate of the alignment mark (measurement difference) is obtained, and a difference between the two design coordinate values (design difference) is further obtained. The positional correction circuit 13 shown in FIG. 9 or FIG. 11 relatively shifts the positions of the alignment marks of the opaque pattern and the phase shift pattern by a distance corresponding to a difference between the measurement difference and the design difference.

With such a structure, it is possible to generate the reference pattern data which simulates the state that the displacements of the actual opaque pattern and phase shifting pattern are produced. For example, when performing the operation of the reference data acquisition circuit 8 based on the opaque pattern, it is good enough to add to the opaque pattern data the phase shifting pattern data which reflects the distortion/rotation error measured with the alignment marks for the phase shifting pattern.

The positional correction circuit 13 is comprised of input buffers 130 and 131, a re-sampling circuit 132, and delay buffers 133 and 134. The two-dimensional patterns which are cut out and scanned in a y direction (direction indicated by an arrow 135) are sequentially inputted to the buffers 130 and 131 from the bit pattern generation circuit 11.

The re-sampling circuit 132 has a local parallel two-dimensional buffer (not shown), shifts patterns in X and Y directions in units of pixel, and can perform fine adjustment within one pixel by performing weighted addition according to an amount of shifting.

Figure 15:
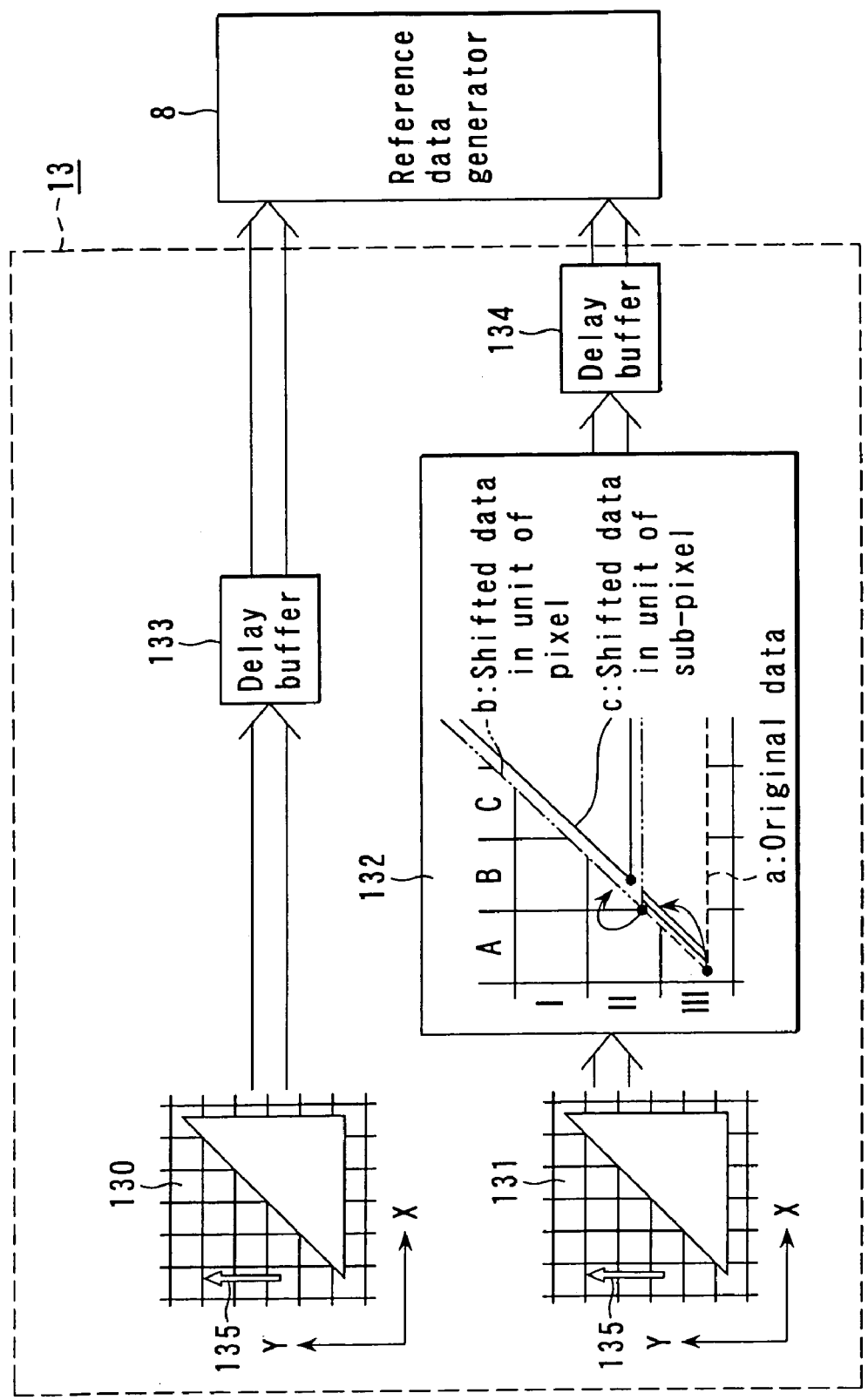
FIG. 15 shows a structural example of a positional correction circuit according to the first embodiment.

In the structure of FIG. 15, the opaque pattern data is inputted to the input buffer 130, and the phase shifting pattern data is inputted to the input buffer 131, thereby finely adjusting the displacement of the phase shifting pattern data. The delay buffers 133 and 134 adjust synchronization of data on the opaque pattern data side and the phase shifting pattern data side. Usually, a delay amount of zero is set to the delay buffer 134, and a delay quantity which compensates delay generated in the re-sampling circuit 132 is set to the delay buffer 133.

In FIG. 15, as to calculation in the re-sampling circuit 132 concerning brightness of an arbitrary pixel, assuming that respective weighted attributes of the two-dimensional matrixes AI to CIII are $k_1$ to $k_9$, weighted addition is performed to each pixel. For example, the brightness A of the pixel in BII is calculated in accordance with the following expression.

$$A = k_1 AI + k_2 BI + k_3 CI + k_4 AII + k_5 BII + k_6 CII + k_7 AIII + k_8 BIII + k_9 CIII$$

Incidentally, when the rotational displacement is generated as shown in FIG. 12B, en error in angle must be also taken into consideration in a narrow sense, but an error in rotational angle can be locally approximated by a parallel displacement in a local scope of this apparatus.

Further, although the above has described the method of generating the inspection reference data by correction the position of the data for the phase shifting pattern when performing the operation of the reference data generation circuit 8 based on the opaque pattern, the position of the design pattern data for the opaque pattern can be of course corrected based on the alignment marks for the phase shifting pattern conversely.

(Second Embodiment)

Figure 16:
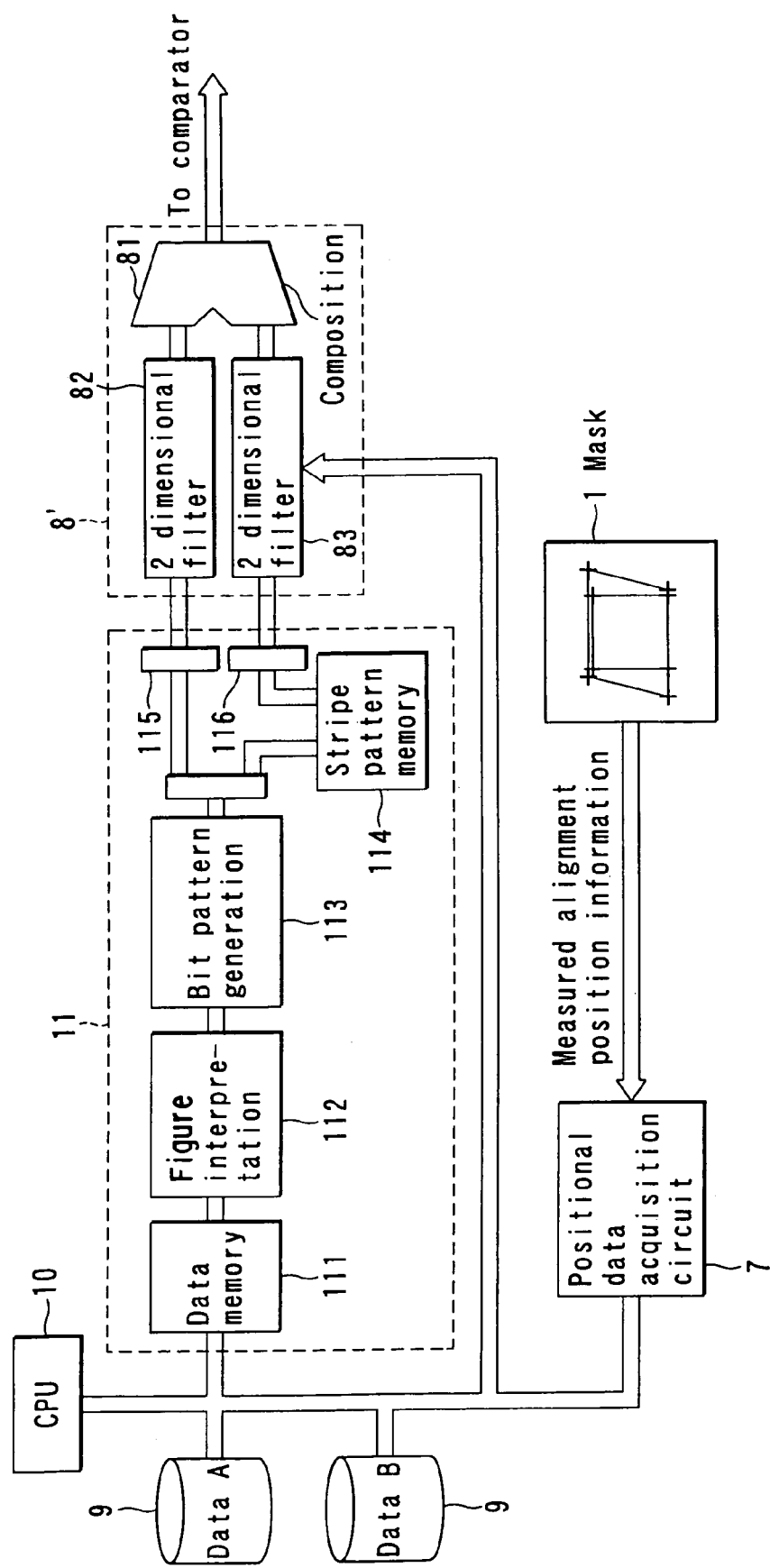
FIG. 16 is a block diagram of a primary part of a pattern inspection apparatus according to the second embodiment.

FIG. 16 is a block diagram showing a structure of a pattern inspection apparatus according to a second embodiment. In the above-described first embodiment, the displacement of the actual measured pattern from the design pattern is corrected by the positional correction circuit 13, and mask rotation or expansion and contraction is corrected by the filter circuit 82 in the reference data generation circuit 8 based on the measured alignment position information. In the second embodiment, however, this function is modified as follows.

In the filter circuit 82, as to the distortion generated due to expansion and contraction/rotation produced in the inspected pattern, the design data is corrected based on each of measured alignment mark information by correction processing or expansion and contraction correction processing which proportionally distributes the displacements at four position, thereby generating inspection reference data (reference data) which excellently matches the inspected pattern observed by filtering.

In the second embodiment, as shown in FIG. 16, there are prepared two filter circuits 82 and 83 which function to correct such expansion and contraction/rotation. That is, one filter circuit 82 corrects the distortion generated in the opaque pattern based on the measured alignment position information for the opaque pattern, and the other filter circuit 83 corrects the distortion generated in the phase shifting pattern based on the measured alignment position information for the phase shifting pattern.

Thereafter, a light intensity amplitude, a phase or the like of each of the opaque pattern and the phase shifting patter is taken into consideration, and they are composed in the composition part 81 in the reference data generation circuit 8'. The filter circuits 82 and 83 further apply filtering processing in order to simulate the blur caused due to the resolving characteristic of the magnification optics 4, the aperture effect of the photodiode array 5 or the coherence between adjacent pixels.

In this method, two filter circuits 82 and 83 having a distortion correction function are required in the reference data generation circuit 8', but the positional displacement correction circuit 13 which is required in the first embodiment is no longer necessary. The bit pattern generation circuit 11 is the same as that in the first embodiment (FIG. 11), and it is capable of sequentially performing bit pattern conversion of the opaque pattern and the phase shifting pattern by including a stripe pattern memory 114 therein. Therefore, it is good enough to provide only one line for the data memory 111, the figure interpretation 112 and the bit pattern generation 113.

(Third Embodiment)

Figure 17:
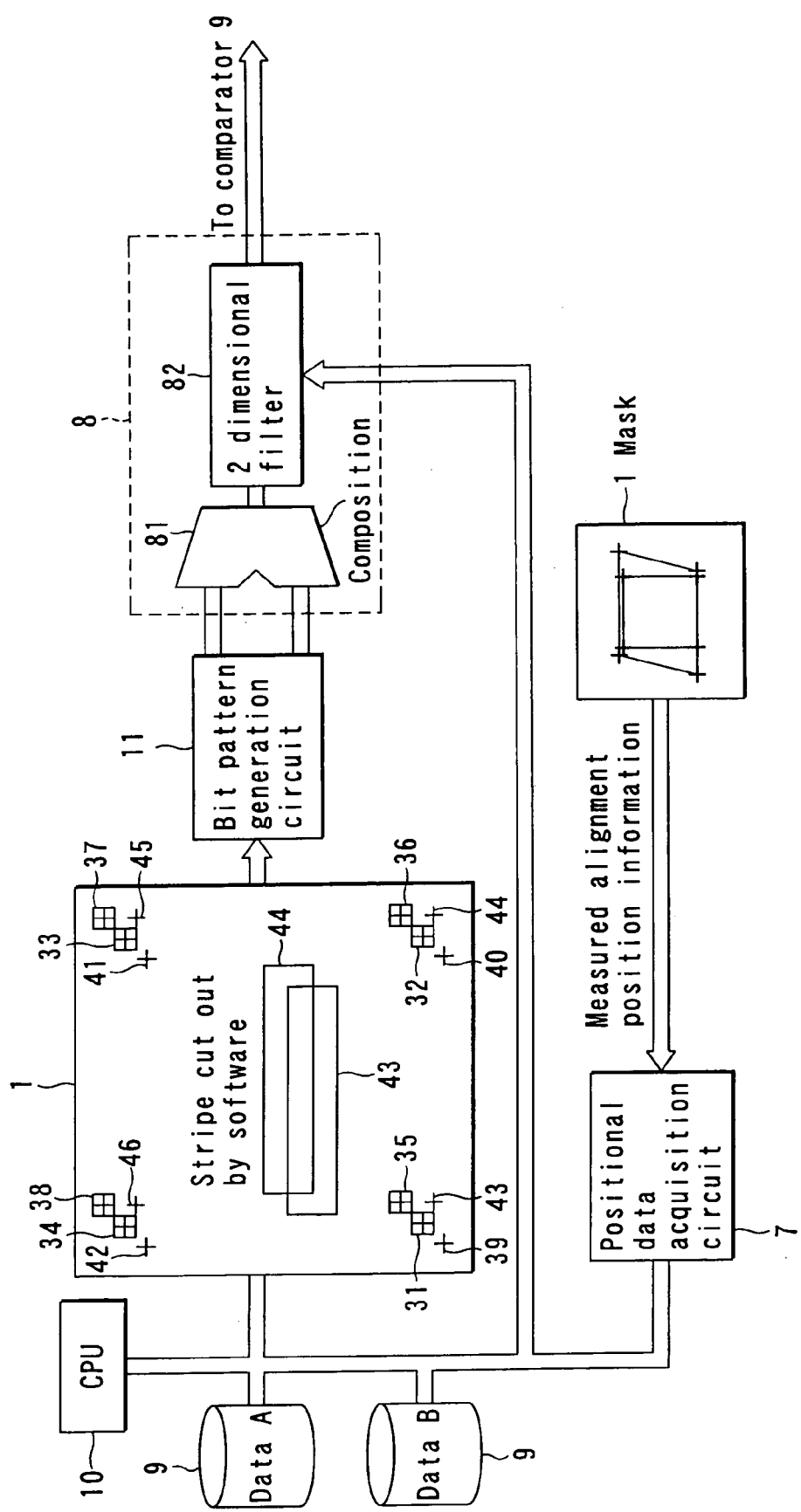
FIG. 17 is a block diagram of a primary part of a pattern inspection apparatus according to the third embodiment.

FIG. 17 is a block diagram showing a structure of a pattern inspection apparatus according to a third embodiment. The above-described first and second embodiments require hardware used for correcting the displacement of the opaque pattern and the phase shifting pattern (namely, the positional correction circuit 13 or the filter circuits 82 and 83). The third embodiment realizes what the hardware executes by using software.

In the third embodiment, description will be given as to a method which generates reference data by subjecting data for the phase shifting pattern to positional correction in terms of software when performing the operation of the reference data generation circuit 8 based on the opaque pattern.

In FIG. 17, data A for the opaque pattern (chrome pattern) and data B for phase shifting pattern are stored in the disk 9. The control computer (CPU) 10 reads positional information of respective alignment marks from the data A and B stored in the disk 9. Then, the control computer 10 drives XYθ table 2 to measure the positions of the alignment marks on a measured sample (actual mask). More specifically, when the measured pattern acquisition circuit 6 fetches a pattern of the alignment mark, the positional data acquisition circuit 7 correspondingly gives information about the actual coordinates of the alignment mark. In the above procedure, it is assumed that the actually measured opaque pattern alignment mark positions are inputted as 31 to 34 with respect to the opaque pattern alignment mark positions 39 to 42 in design and marks for the actually measured phase shifting pattern are inputted as 35 to 38 with respect to the phase shifting pattern alignment mark positions 43 to 46 in design.

The basic opaque pattern (chrome pattern) data is obtained by extracting an inspection stripe area with a predetermined width from chip data and supplied to the bit pattern generation circuit 11. The bit pattern generation circuit 11 is not shown in FIG. 17, but it interprets the data, generates a bit pattern and temporarily stores it in a stripe memory (114) as similar to that shown in FIG. 9.

The phase shifting pattern data is obtained by determining as an extracted area the position shifted from the opaque mask pattern data by a preset amount. The preset amount is calculated by subtraction of a difference between the alignment mark design coordinates 39 to 42 for the opaque pattern and the alignment mark design coordinates 43 to 46 for the phase shifting pattern (difference in design value) from a difference between the measured alignment mark coordinates 31 to 34 for the opaque pattern and the measured alignment mark coordinates 35 to 38 for the phase shifting pattern (difference in actually measured value). The phase shifting pattern data is supplied to the bit pattern generation circuit 11. The bit pattern generation circuit 11 interprets the data, generates a bit pattern, and outputs it to the reference data generation circuit 8. At that moment, however, it also synchronously outputs bit pattern data for the opaque pattern previously developed and stored in the stripe memory (114).

The two pattern data outputted from the bit pattern generation circuit 11 in synchronization with each other are inputted into the reference data generation circuit 8, wherein they are handled as vector data having a light intensity amplitude and phase with respect to each of the opaque pattern and the phase shifting pattern, as in the first embodiment. The composition of these two data includes not only mere addition of the amplitude data but also complex number operation involving the positional information. Furthermore, in order to simulate the blur caused to due to the resolving characteristic of the magnification optics 4, the aperture effect of the photodiode array 5 or the coherence between adjacent pixels, filtering processing is applied by the two-dimensional filter circuit 82.

The output from the reference data generation circuit 8 is inputted to the comparison circuit 9, and compared with the measured pattern data fetched by the sensor 5 in accordance with an appropriate algorithm. If they do not match, it is determined that there is a defect.

In this method, since the stripe cutout position obtained by software already reflects the displacement of the opaque pattern and the phase shifting pattern, it is possible to generate inspection reference data which perfectly matches the inspected pattern without any special hardware as with the positional correction circuit 13 (FIG. 11) according to the first embodiment, or the two filters 82 and 83 (FIG. 16) in the reference data generation circuit 8 according to the second embodiment.

(Fourth Embodiment)

Figure 18:
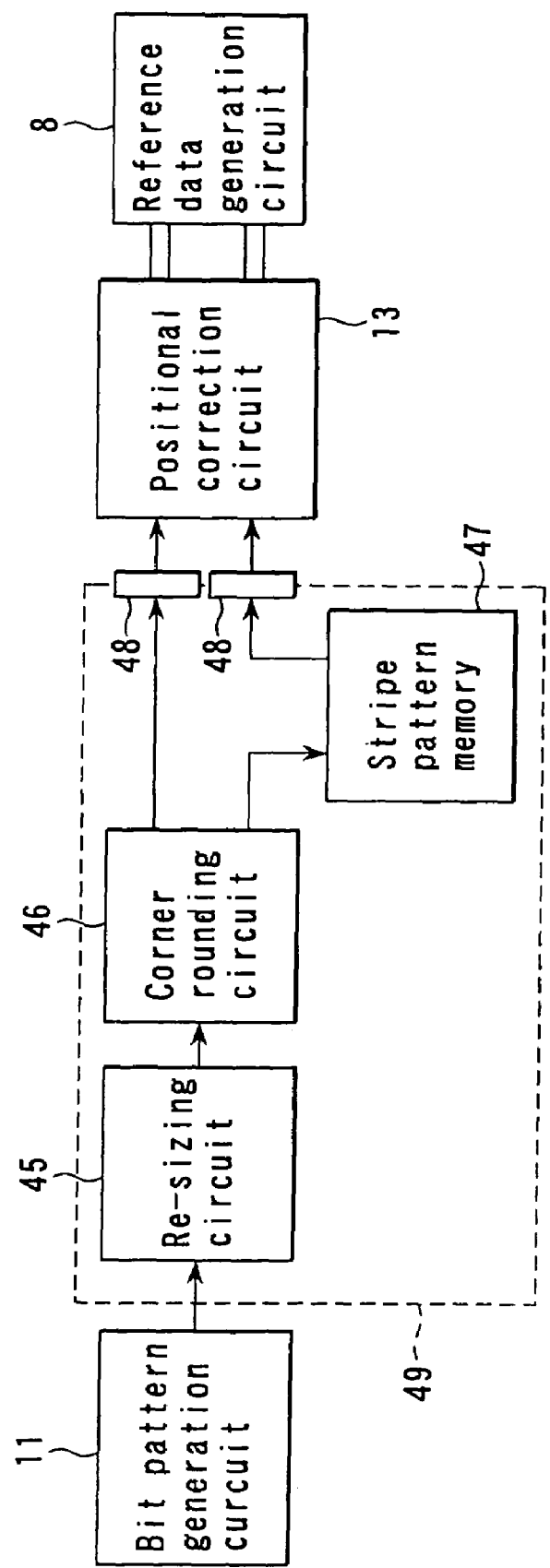
FIG. 18 is a block diagram of a primary part of a pattern inspection apparatus according to the fourth embodiment.

FIG. 18 is a block diagram showing a structure of a primary part of a pattern inspection apparatus according to a fourth embodiment.

As in the relative lithography positional displacement of the opaque pattern and the phase shifting pattern, there may possibly occur an unexpected variation in a finished line width of each of the opaque pattern and the phase shifting pattern or in degree of rounding of the pattern generated at a pattern corner due to a difference in process when forming the patterns. In the fourth embodiment, as shown in FIG. 18, re-sizing processing and corner rounding processing for difference in sizes can be applied to each of the opaque pattern and the phase shifting pattern by adding a correction circuit for resizing or corner rounding.

Figure 19:
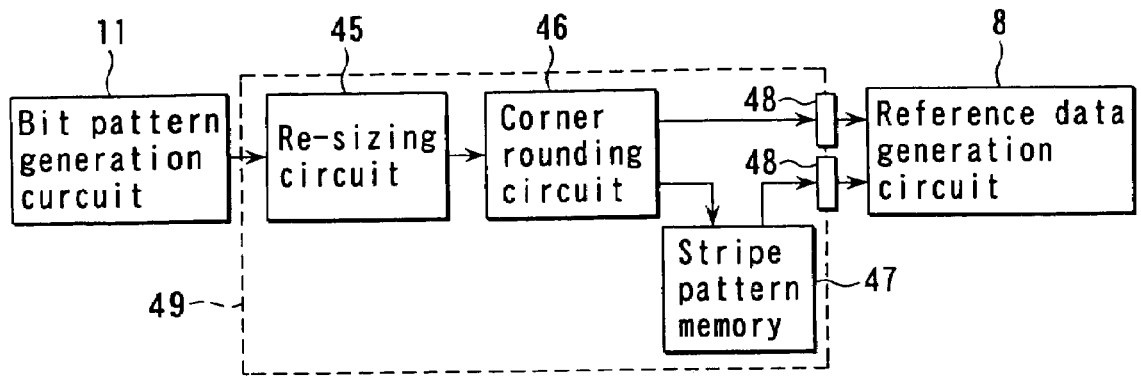
FIG. 19 is a block diagram in which a resizing/corner rounding correction circuit 49 according to the fourth embodiment.

FIG. 19 is a block diagram in which the above-described positional correction circuit 13 is omitted in order to facilitate explanation of a re-sizing/corner rounding correction circuit 49. Although not shown in FIG. 19, data A for the opaque pattern (chrome pattern) and data B for the phase shifting pattern are stored in the disk 9 as illustrated in FIG. 11. The control computer (CPU) 10 reads data, measures an alignment mark coordinate on a measured sample (actual mask), reads a monitor mark formed on the measured sample and measures a line width of the pattern or the dimensions of the corner pattern, for pre-inspection operations.

Figure 20A:
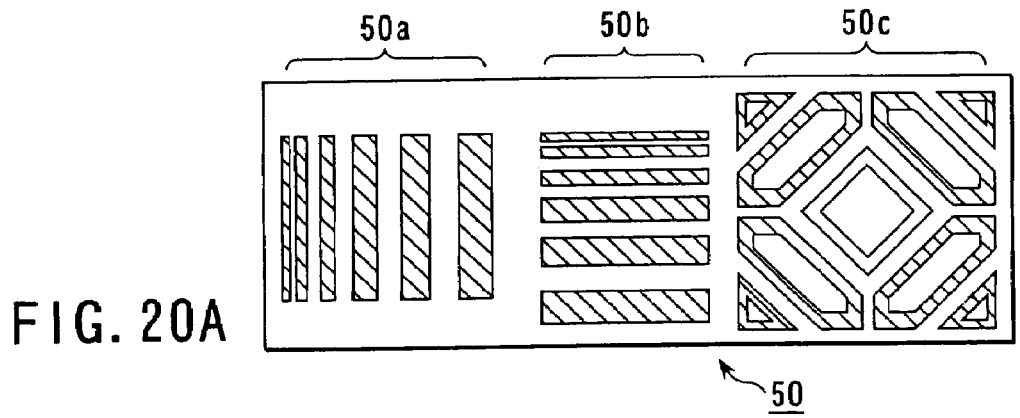
FIGS. 20A and 20B respectively show an example and an arrangement example of a resizing/corner rounding monitor mark.
Figure 20B:
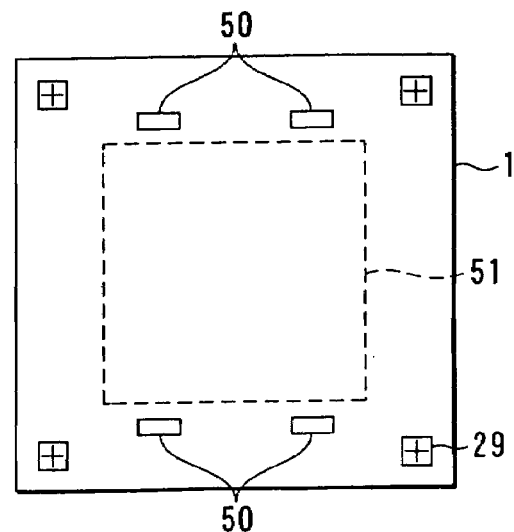

As shown in FIGS. 20A and 20B, in the monitor mark 50, vertical and horizontal line/space patterns 50a and 50b having appropriate line widths or a mark 50c including a right angle or corners of 135 degrees and 45 degrees are arranged at parts which do not overlap an inspected area 51.

Since the monitor mark 50 is also formed through the lithography/process similar to that of the inspected actual pattern, it is possible to obtain a re-sizing dimension and a corner rounding dimension suitable for the actual pattern by measuring the line width by using the monitor mark 50 or measuring the corner rounding shape. Since it can be predicted that the dimension variations for the opaque pattern (chrome pattern) and those for the phase shifting pattern are different, the monitor mark 50 is arranged so as to enable measurement of each dimension.

A shaded area in FIG. 20A indicates the opaque pattern (circumference thereof indicates glass), but two marks comprising the above opaque pattern and the phase shifting pattern which is produced by forming with the same pattern the shaded area by using the phase shifting pattern are determined as one set, and it is arranged at the outer peripheral portion of the inspected pattern area 51. For example, as shown in FIG. 20B, it is good enough that the two monitor marks 50 on the upper part are determined as one set and the two monitor marks 50 on the lower part are determined as another set.

Here, although the method of processing for thickening or thinning the pattern line width of the bit-converted design pattern data (re-sizing) or processing for rounding the corner of the corner pattern (corner rounding) is no object, a processing method in which thickening/thinning of up to two to three pixels is possible in the re-sizing processing and having a set resolution, which is approximately 1/10 of that of one pixel, is desirable.

It is possible to specify a rounding dimension to each corner of 135 degrees, 45 degrees as well as 90 degrees in the corner rounding processing, and capability of discriminating irregularities is necessary. Therefore, the processing method having a set resolution for approximately up to three to four pixels, or approximately 1/10 of that of one pixel is desirable.

Since a concrete processing circuit can use a textbook technique such as scanning a template of three pixels×three pixels, calculating a value of a central pixel for substitution, description of such a circuit is omitted here.

As to a required amount of line width adjustment (re-sizing dimension) measured by the monitor mark and a required amount of corner rounding, a set value measured with the opaque pattern is set to the re-sizing circuit 45 and the corner rounding circuit 46 for the opaque pattern data, and a design value measured with the phase shifting pattern is set to the re-sizing circuit 45 and the corner rounding circuit 46 for the phase shifting pattern data.

In the structure of FIG. 19, an output from the corner rounding circuit 46 with respect to the opaque pattern data, for example, is led to the stripe pattern memory 47 and the pattern data for one inspection stripe is held therein, and then an output from the corner rounding circuit 46 with respect to the phase shifting pattern data is supplied to the reference data generation circuit 8 through the synchronization buffer 48, the content of the stripe pattern memory 47 is read and the opaque pattern data is also outputted in synchronization with the phase shifting pattern data.

The respective outputted pattern data is inputted to the reference data generation circuit 8, wherein they are handled as vector data having a light intensity amplitude and phase with respect to each of the opaque pattern and the phase shifting pattern, as in the first embodiment. The composition of these two data includes not only mere addition of the amplitude data but also complex number operation involving the positional information. Moreover, filtering processing is applied to simulate the blur caused due to the resolving characteristic of the magnification optics 4, the aperture effect of the photodiode array 5, the coherence between adjacent pixels or the like.

The output from the reference data generation circuit 8 is inputted to the comparison circuit 9, and compared with the measured pattern data fetched by the sensor 5 in accordance with an appropriate algorithm. If they do not match, it is determined that there is a defect.

As shown in FIG. 18, combination of setting of a re-sizing amount and a corner rounding amount which differ depending on the opaque pattern and the phase shifting pattern and correction of the displacement generated in the opaque pattern and the phase shifting pattern in connection with the first embodiment is effective for producing better reference data.

(Fifth Embodiment)

Figure 21:
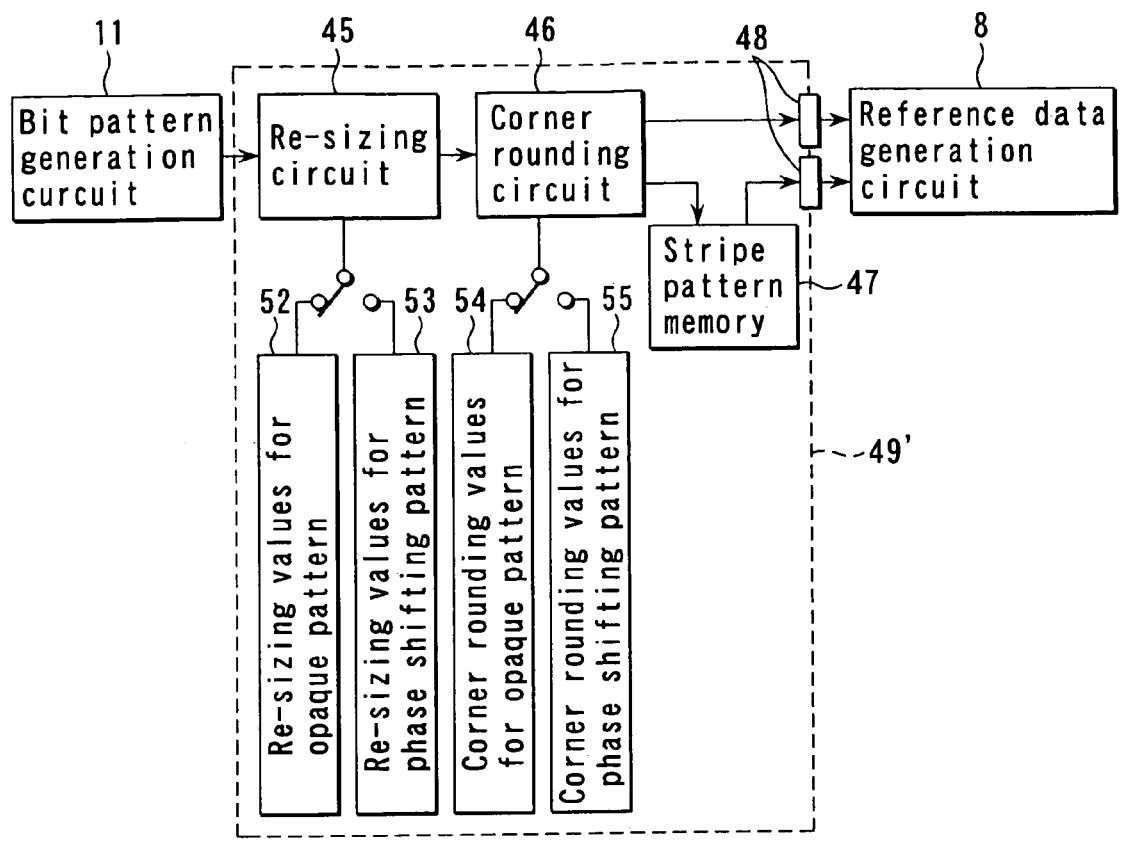
FIG. 21 is a block diagram in which a resizing/corner rounding correction circuit 49' in a pattern inspection apparatus according to the fifth embodiment is extracted.

A fifth embodiment is a modification of the fourth embodiment, and FIG. 21 is a block diagram showing a primary part. The correction circuit 49' is configured to store the re-sizing dimension or the radius of corner rounding required in re-sizing/corner rounding for both the opaque pattern data and the phase shift pattern data in the hardware in advance, and rapidly change the circuit operation state in accordance with data to be processed.

As shown in FIG. 21, there are provided registers 52 to 55 which store therein the re-sizing value and the amount of corner rounding, and a set value previously measured with the opaque pattern and a set value previously measured with the phase shifting pattern are stored in each register.

When processing the opaque pattern data, the set value for the opaque pattern is set in the re-sizing circuit and the corner rounding circuit. Also, when processing the phase shifting pattern data, the set value of the phase shifting pattern is read from the register and set in the re-sizing circuit 45 and the corner rounding circuit 46.

By doing so, it is no longer necessary to write the re-sizing value and the amount of corner rounding every time data switching is performed from the control computer 10, thereby shortening the processing time.

(Sixth Embodiment)

Figure 22:
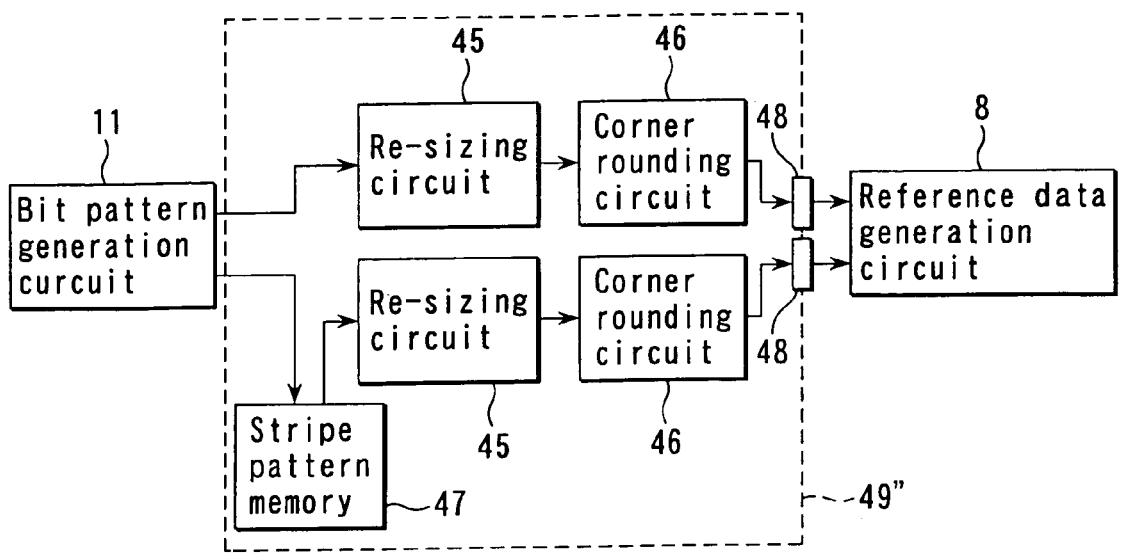
FIG. 22 is a block diagram in which a resizing/corner rounding correction circuit 49" in a pattern inspection apparatus according to the sixth embodiment is extracted.

A sixth embodiment is another modification of the fourth embodiment, and FIG. 22 is a block diagram showing a primary part.

In the fourth or fifth embodiment, the stripe pattern memory 47 is inserted at the rear of the re-sizing circuit 45 and the corner rounding circuit 46. In the sixth embodiment, however, as shown in FIG. 22, the stripe memory 47 in the re-sizing/corner rounding correction circuit 49" is inserted before the re-sizing circuit 45 and the corner rounding circuit 46 (immediately after the bit pattern generation circuit 11).

In such a structure, it is possible to realize the effect for setting the amount of re-sizing and the amount of corner rounding which differ depending on the opaque pattern and the phase shifting pattern.

In the above-described first to sixth embodiments, if the displacement, the re-sizing error and the corner rounding which are allowable in the scope of the invention are generated, the inspection reference data can be corrected so as not to lead to a false defect, thereby performing efficient correction.

However, an amount of correcting the displacement, the re-sizing or the corner rounding exceeds a stipulated value, it is necessary to generate a warning and terminate the processing without performing inspection. In a seventh embodiment, description will be given as to such an example.

(Seventh Embodiment)

Figure 23:
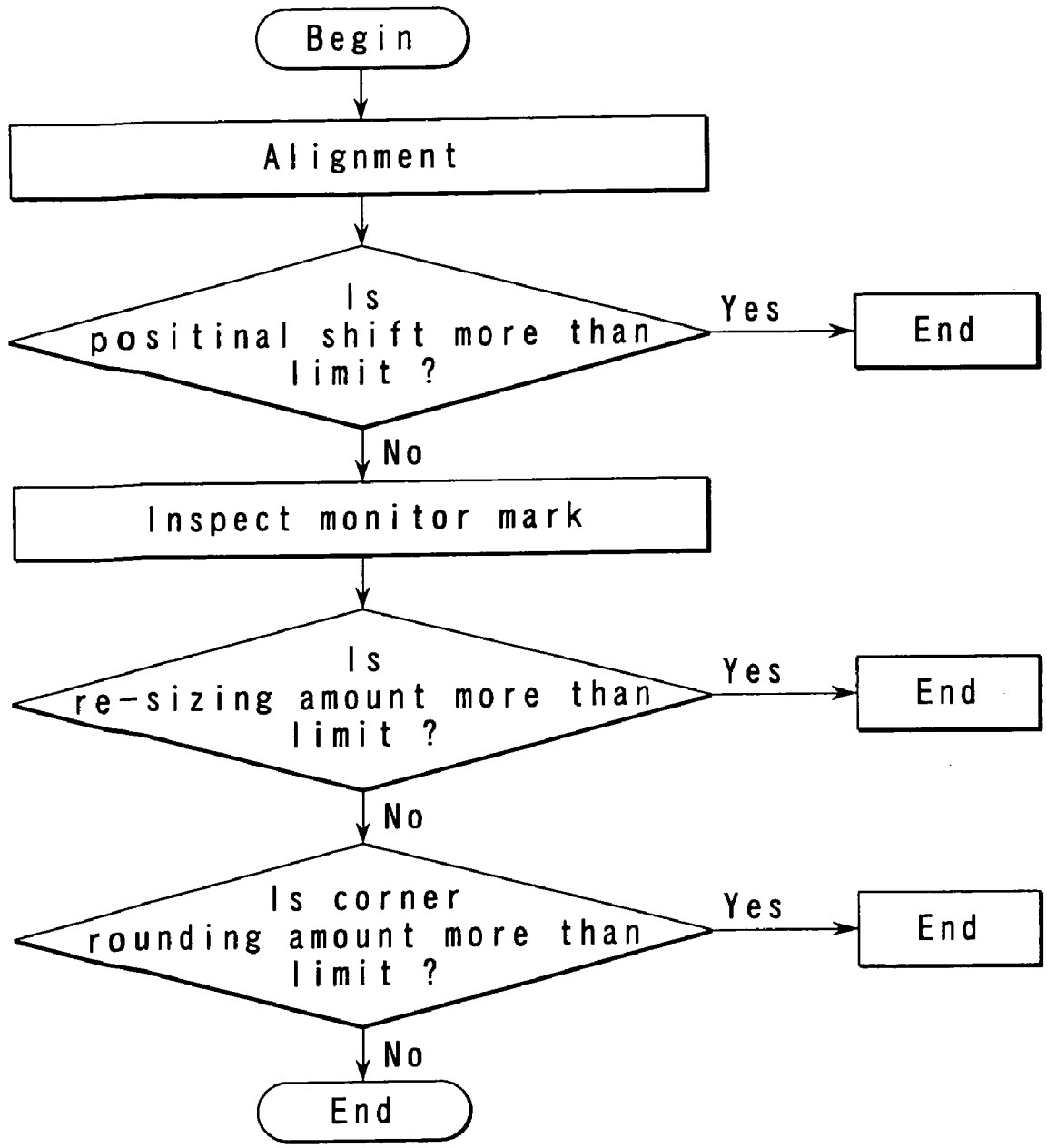
FIG. 23 is a flowchart showing a warning generation procedure according to the seventh embodiment.

FIG. 23 is a flowchart showing a procedure of generating a warning according to the seventh embodiment. At first, in case of the displacement, the alignment marks corresponding to the opaque pattern design data (31 to 34 in FIG. 13) and the alignment marks corresponding to the phase shifting pattern design data (35 to 38 in FIG. 13) are respectively measured in the process of alignment carried out before inspection, and they are temporarily fetched into the control computer 10.

Then, on a step of calculating the displacement from the arrangement position in design, reference is made to a displacement tolerance written in a parameter file or the like, and judgment is made upon whether the displacement exceeds this tolerance. If it exceeds the tolerance, a warning is generated and the processing is terminated without starting the inspection.

Subsequently, the processing advances to the inspection of re-sizing and corner rounding, but the method for detecting an error in re-sizing can be carried out as follows. As shown in FIGS. 20A and 20B, a re-sizing/corner rounding monitor mark 50 arranged at an outer peripheral part of the chip area of the mask 1 is temporarily inspected, a sensor fetch image and a reference pattern image are fetched into the computer 10, and a re-sizing dimension required for matching the line widths of the patterns is determined by comparing the both images by appropriate calculation processing. At this moment, when the re-sizing tolerance written in a parameter file or the like in advance is exceeded, a warning is generated and the processing is terminated without starting the inspection.

Similarly, when an amount of correcting the corner rounding dimension exceeds a stipulated value, such a monitor mark 50 as shown in FIGS. 20A and 20B is temporarily inspected, the sensor fetch image and the reference pattern image are fetched into the control computer 10, and the both images are compared with each other by appropriate calculation processing. By doing so, there is obtained an amount of rounding with which the corner pattern part applied to the reference pattern image excellently matches with the sensor fetch. At this moment, when it is determined that the corner rounding dimension tolerance written in a parameter file or the like is exceeded, a warning is generated and the processing is terminated without starting the inspection.

The above-described operation can be realized by assembling the software in the control computer 10 as shown in FIG. 23 in the structure according to the first embodiment illustrated in FIG. 9 without adding new hardware structure requirements.

In the above description and FIG. 23, although the process of alignment indicates a technique carried out by using the alignment marks whose shape and arrangement positions are determined in advance, it is basically good enough to grasp the positional relationship between the actual pattern formation position corresponding to the opaque pattern design data and the actual phase shifting pattern formation position corresponding to the phase shifting pattern design data. Therefore, if the characteristic of the equivalent displacement can be obtained at a part of the actual pattern without using the alignment marks whose shape and arrangement positions are determined in advance, measuring the displacement in that pattern is also effective.

Similarly, although description has been given as to the example of measuring the re-sizing and corner rounding dimensions by using the monitor mark, it is basically good enough to grasp the actual pattern shapes corresponding to the opaque pattern design data/phase shifting pattern design data. Therefore, it is also effective to measure the equivalent re-sizing dimension or corner rounding dimension at a part of the actual pattern without using the monitor mark whose shape and arrangement position are determined in advance.

As described above, according to the present embodiments, erroneous detection of a false defect can be suppressed by correcting an amount of displacement corresponding to the actual pattern displacement with respect to the design data of the opaque pattern (chrome pattern) and the design data of the phase shifting pattern used when forming a pattern in the photomask, and inspection of defects in the opaque pattern and the phase shifting pattern can be simultaneously performed.

Even if the displacement when forming the mask or an error in the pattern line width or corner rounding generated in the manufacturing process differs depending on the opaque pattern (chrome pattern) and the phase shifting pattern, this can be compensated. Therefore, a false defect is not generated even if the defect detection sensitivity is increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern inspection apparatus which inspects a pattern formed on a plate, comprising:

a pattern data generator configured to generate measured pattern data regarding the pattern on the plate;

a memory which stores first design data and second design data, the first designed data representing an opaque pattern including a first alignment mark and the second designed data representing a phase shifting pattern including a second alignment mark;

a control computer configured to control extraction of a first inspection area and a second inspection area, the first inspection area having a predetermined width from one of the first design data and the second design data, the second inspection area being obtained by correcting a designed position of one of the first alignment mark and the second alignment mark by a difference between a measured data difference and a designed data difference with respect to the other of the first designed data and the second designed data, the measured data difference concerning a difference of respective measured data of the first alignment mark and the second alignment mark which are obtained based on the measured pattern data, and the designed data difference concerning a difference of respective designed data of the first alignment mark and the second alignment mark;

a bit pattern data generator configured to provide first bit pattern data obtained by converting said one of the first design data and the second designed data included in the first inspection area to a two-dimensional image data configured of squares comprising bit components, and second bit pattern data obtained by converting the other of the first design data and the second designed data included in the second inspection area to another two-dimensional image data configured of squares comprising bit components;

reference pattern data generator configured to generate reference pattern data by performing combining and filtering of the first bit pattern data and the second bit pattern data; and a comparator configured to compare the reference pattern data with the measured pattern data to inspect a defect of the pattern on the plate.

2. The pattern inspection apparatus according to claim 1, wherein the control computer has a function to generate a warning to stop inspection when the measured data difference exceeds a predetermined value.

3. The pattern inspection apparatus according to claim 1, wherein the apparatus inspects the pattern on the plate in which the first alignment mark and the second alignment mark are formed in an outside area of the pattern on at least three corners in four corners of the plate in a rectangular shape.

4. The pattern inspection apparatus according to claim 1, wherein the apparatus inspects the pattern on the plate in which the first alignment mark is formed together with the opaque pattern and the second alignment mark is formed together with the phase shifting pattern.

5. The pattern inspection apparatus according to claim 1, wherein the bit pattern data generator comprises: a data interpretation part configured to sequentially interpret figure data of the first design data and the second pattern design data from the memory; a bit pattern data generation part configured to sequentially generate bit pattern data regarding the first design data and the second design data; and a stripe pattern memory configured to store a precedently generated one of the bit pattern data of either the first design data or the second design data, and outputs the precedently generated bit pattern data in synchronization with a subsequently generated bit pattern data.

* * * * *